(12) United States Patent
Han et al.

(10) Patent No.: US 11,170,829 B2
(45) Date of Patent: Nov. 9, 2021

(54) SEMICONDUCTOR DEVICE PERFORMING DUTY RATIO ADJUSTMENT OPERATION

(71) Applicant: SK hynix Inc., Icheon-si (KR)

(72) Inventors: Min Sik Han, Icheon-si (KR); Sung Chun Jang, Seoul (KR); Jin Il Chung, Namyangju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/858,391

(22) Filed: Apr. 24, 2020

(65) Prior Publication Data

US 2021/0174850 A1 Jun. 10, 2021

(30) Foreign Application Priority Data

Dec. 4, 2019 (KR) .......................... 10-2019-0160239

(51) Int. Cl.
| | | |
|---|---|---|
| *G11C 7/22* | (2006.01) | |
| *G11C 7/10* | (2006.01) | |
| *H04L 7/00* | (2006.01) | |
| *H03L 7/081* | (2006.01) | |
| *G11C 29/56* | (2006.01) | |
| *G11C 11/4076* | (2006.01) | |

(52) U.S. Cl.
CPC ............ *G11C 7/222* (2013.01); *G11C 7/1036* (2013.01); *G11C 7/1051* (2013.01); *G11C 7/1066* (2013.01); *G11C 7/1093* (2013.01); *G11C 11/4076* (2013.01); *G11C 29/56012* (2013.01); *H03L 7/0814* (2013.01); *H04L 7/0037* (2013.01)

(58) Field of Classification Search
CPC ..... G11C 7/222; G11C 7/1036; G11C 7/1051; G11C 29/56012; G11C 11/4076; G11C 7/1093; G11C 7/1066; H03L 7/0814; H04L 7/0037
See application file for complete search history.

(56) References Cited

U.S. PATENT DOCUMENTS

| | | | |
|---|---|---|---|
| 6,339,553 B1 * | 1/2002 | Kuge | H03K 5/131 365/194 |
| 7,642,869 B2 | 1/2010 | Fujii | |
| 2001/0047464 A1 * | 11/2001 | Shinozaki | G06F 13/4243 711/167 |
| 2009/0168552 A1 * | 7/2009 | Yoon | G11C 7/1072 365/189.07 |
| 2017/0053684 A1 * | 2/2017 | Choi | G11C 16/32 |
| 2020/0373929 A1 * | 11/2020 | Jang | G06F 1/12 |

FOREIGN PATENT DOCUMENTS

KR 1020170093381 A 8/2017

* cited by examiner

*Primary Examiner* — Mushfique Siddique
(74) *Attorney, Agent, or Firm* — William Park & Associates Ltd.

(57) ABSTRACT

A semiconductor device includes an internal clock generation circuit and a data processing circuit. The internal clock generation circuit delays first to fourth division clock signals, which are generated by dividing a frequency of a clock signal, by a delay time adjusted based on a first code signal and a second code signal to generate first to fourth internal clock signals. The data processing circuit aligns internal data in synchronization with the first to fourth internal clock signals to generate output data. The data processing circuit also interrupts generation of the output data based on first and second command blocking signals according to a point in time when a read command is inputted.

21 Claims, 23 Drawing Sheets

FIG. 2

| OPERATION | OP<1:2> |
|---|---|
| DISABLE | 00 |
| BLOCK-ICLK | 01 |
| BLOCK-IBCLK | 10 |

SEMICONDUCTOR DEVICE PERFORMING DUTY RATIO ADJUSTMENT OPERATION

CROSS-REFERENCE TO RELATED APPLICATIONS

The present application claims priority under 35 U.S.C 119(a) to Korean Application No. 10-2019-0160239, filed on Dec. 4, 2019, which is incorporated herein by reference in its entirety.

BACKGROUND

1. Technical Field

Embodiments of the present disclosure relate to semiconductor devices performing a duty ratio adjustment operation for adjusting phases of internal clock signals.

2. Related Art

As semiconductor systems are developed to operate at a high speed, high data transmission rates (or data communication at high bandwidth) between semiconductor devices included in the semiconductor systems have been increasingly in demand. In response to such a demand, advanced technologies have been proposed. For example, a clock dividing technology may be used to receive or output data at a high speed. If a clock signal is divided, a plurality of multi-phase clock signals may be generated to have different phases from each other. In such a case, data may be parallelized or serialized using the plurality of multi-phase clock signals to improve a transmission speed of the data which are inputted to or outputted from the semiconductor devices.

SUMMARY

According to an embodiment, a semiconductor device includes an internal clock generation circuit and a data processing circuit. The internal clock generation circuit is configured to delay first to fourth division clock signals, which are generated by dividing a frequency of a clock signal, by a delay time adjusted based on a first code signal and a second code signal to generate first to fourth internal clock signals. The data processing circuit is configured to align internal data in synchronization with the first to fourth internal clock signals to generate output data and is configured to interrupt generation of the output data based on first and second command blocking signals according to a point in time when a read command is inputted.

According to another embodiment, a semiconductor system includes a first semiconductor device and a second semiconductor device. The first semiconductor device is configured to detect valid periods of output data during a duty ratio adjustment operation to generate first and second code signals and first and second command blocking signals. The second semiconductor device is configured to generate the output data from internal data in synchronization with first to fourth internal clock signals generated by delaying first to fourth division clock signals by a delay time adjusted based on the first and second code signals and is configured to interrupt generation of the output data based on the first and second command blocking signals.

According to yet another embodiment, a method of adjusting a duty ratio of a signal includes entering the duty ratio adjustment operation according to an operation code signal, changing logic levels of a first code signal and a second code signal during the duty ratio adjustment operation, adjusting phases of internal clock signals generated from a clock signal using delay times which are set by the first code signal and the second code signal, and aligning internal data in synchronization with the internal clock signals to generate output data and detecting valid periods of the output data.

BRIEF DESCRIPTION OF THE DRAWINGS

FIG. 2 is a table illustrating various logic level combinations of an operation code signal for performing a duty ratio adjustment operation of a semiconductor system according to an embodiment of the present disclosure.

DETAILED DESCRIPTION

In the following description, when a parameter is referred to as being "predetermined," it may be intended to mean that a value of the parameter is determined in advance of when the parameter is used in a process or an algorithm. The value of the parameter may be set when the process or the algorithm starts or may be set during a period when the process or the algorithm is executed.

It will be understood that although the terms "first," "second," "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
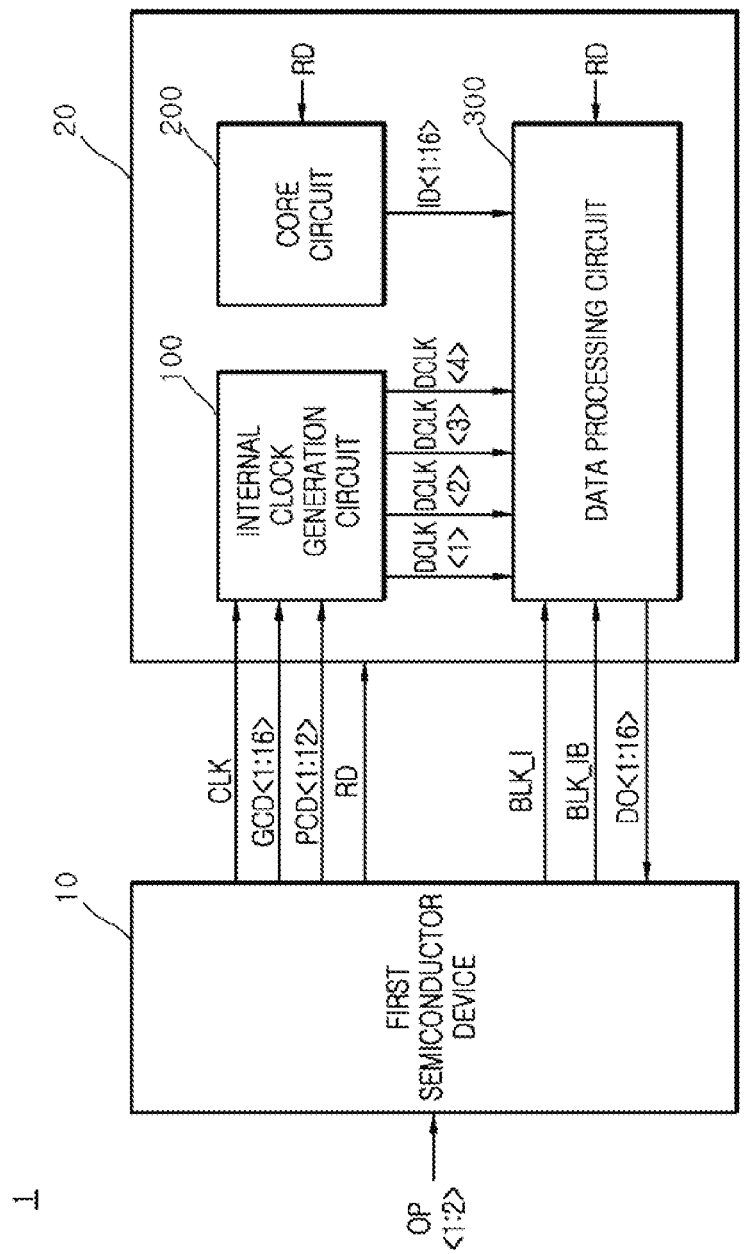
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a first semiconductor device 10 and a second semiconductor device 20. The second semiconductor device 20 may include an internal clock generation circuit 100, a core circuit 200, and a data processing circuit 300.

The first semiconductor device 10 may receive an operation code signal OP<1:2> to perform a duty ratio adjustment operation. The first semiconductor device 10 may output a clock signal CLK, a read command RD, a first code signal GCD<1:16>, a second code signal PCD<1:12>, a first command blocking signal BLK_I, and a second command blocking signal BLK_IB to the second semiconductor device 20 during the duty ratio adjustment operation. The first semiconductor device 10 may change a logic level combination of the first command blocking signal BLK_I and the second command blocking signal BLK_IB until output data DO<1:16> are generated to have a valid period corresponding to a predetermined pulse width during the duty ratio adjustment operation. The first semiconductor device 10 may generate the first command blocking signal BLK_I for blocking generation of the output data DO<1:16> when the read command RD is outputted from the first semiconductor device 10 in synchronization with a rising edge of the clock signal CLK. The first semiconductor device 10 may generate the second command blocking signal BLK_IB for blocking generation of the output data DO<1:16> when the read command RD is outputted from the first semiconductor device 10 in synchronization with a falling edge of the clock signal CLK.

The internal clock generation circuit 100 may adjust a delay time based on the first code signal GCD<1:16> and the second code signal PCD<1:12>. The internal clock generation circuit 100 may divide a frequency of the clock signal CLK to generate first to fourth division clock signals (ICLK, QCLK, IBCLK, and QBCLK of FIG. 3). The internal clock generation circuit 100 may delay the first to fourth division clock signals (ICLK, QCLK, IBCLK, and QBCLK of FIG. 3) by a delay time adjusted by the first code signal GCD<1:16> and the second code signal PCD<1:12> to generate first to fourth internal clock signals DCLK<1:4>.

The core circuit 200 may output internal data ID<1:16> stored therein when the read command RD is inputted to the core circuit 200. The core circuit 200 may output the internal data ID<1:16> having a set pattern when the read command RD is inputted to the core circuit 200 during the duty ratio adjustment operation. The set pattern of the internal data ID<1:16> may correspond to a pattern for which all bits included in the internal data ID<1:16> have a logic "high" level. Alternatively, the set pattern of the internal data ID<1:16> may correspond to a pattern for which all of the bits included in the internal data ID<1:16> have a logic "low" level or may correspond to another pattern for which some of the bits included in the internal data ID<1:16> have a logic "low" level and the remaining bits included in the internal data ID<1:16> have a logic "high" level. The set pattern of the internal data ID<1:16> may be provided to have the same logic levels as the output data DO<1:16> such that the first semiconductor device 10 detects a valid period of the output data DO<1:16>.

The data processing circuit 300 may align the internal data ID<1:16> in synchronization with the first to fourth internal clock signals DCLK<1:4> to generate the output data DO<1:16> when the read command RD is inputted to the data processing circuit 300. The data processing circuit 300 may interrupt the generation of the output data DO<1:16> based on the first command blocking signal BLK_I and the second command blocking signal BLK_IB when the read command RD is inputted to the data processing circuit 300. The data processing circuit 300 may generate the output data DO<1:16> driven by external voltages based on the first command blocking signal BLK_I and the second command blocking signal BLK_IB when the read command RD is inputted to the data processing circuit 300. The external voltages may be set by a power supply voltage (VDD of FIG. 5) and a ground voltage (VSS of FIG. 5) which are used in the semiconductor system 1.

Various logic level combinations of the operation code signal OP<1:2> for performing the duty ratio adjustment operation of the semiconductor system 1 will be described hereinafter with reference to FIG. 2.

First, when the duty ratio adjustment operation is disabled, the operation code signal OP<1:2> may be set to have a logic level combination of '00.'

Next, in a first case (BLOCK_ICLK) for which the read command RD is synchronized with a rising edge of the clock signal CLK to block the generation of the output data DO<1:16> during the duty ratio adjustment operation, the operation code signal OP<1:2> may be set to have a logic level combination of '01.' In the operation code signal OP<1:2>, the logic level combination of '01' means that a first bit OP<1> of the operation code signal OP<1:2> has a logic "high" level and a second bit OP<2> of the operation code signal OP<1:2> has a logic "low" level.

Next, in a second case (BLOCK_IBCLK) for which the read command RD is synchronized with a falling edge of the clock signal CLK to block the generation of the output data DO<1:16> during the duty ratio adjustment operation, the operation code signal OP<1:2> may be set to have a logic level combination of '10.' In the operation code signal OP<1:2>, the logic level combination of '10' means that a first bit OP<1> of the operation code signal OP<1:2> has a logic "low" level and a second bit OP<2> of the operation code signal OP<1:2> has a logic "high" level.

Figure 3:
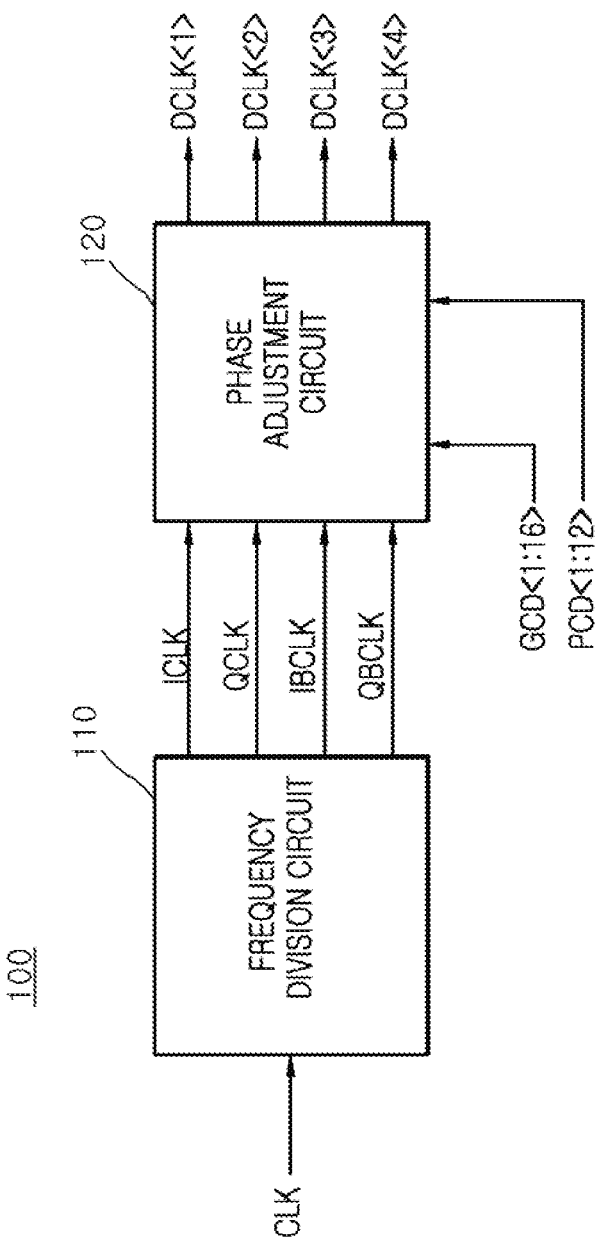
FIG. 3 is a block diagram illustrating a configuration of an internal clock generation circuit included in the semiconductor system of FIG. 1.

FIG. 3 is a block diagram illustrating a configuration of the internal clock generation circuit 100. As illustrated in FIG. 3, the internal clock generation circuit 100 may include a frequency division circuit 110 and a phase adjustment circuit 120.

The frequency division circuit 110 may divide a frequency of the clock signal CLK to generate the first division clock signal ICLK, the second division clock signal QCLK, the third division clock signal IBCLK, and the fourth division clock signal QBCLK. The frequency division circuit 110 may generate the first to fourth division clock signals ICLK, QCLK, IBCLK, and QBCLK having a frequency which is half a frequency of the clock signal CLK. A phase difference among the first to fourth division clock signals ICLK, QCLK, IBCLK, and QBCLK may be 90 degrees. The first division clock signal ICLK may be generated in synchronization with a rising edge of the clock signal CLK. The third division clock signal IBCLK may be generated in synchronization with a falling edge of the clock signal CLK.

The phase adjustment circuit 120 may delay the first to fourth division clock signals ICLK, QCLK, IBCLK, and QBCLK by a delay time adjusted according to the first and second code signals GCD<1:16> and PCD<1:12> to generate the first internal clock signal DCLK<1>, the second internal clock signal DCLK<2>, the third internal clock signal DCLK<3>, and the fourth internal clock signal DCLK<4>.

Figure 4:
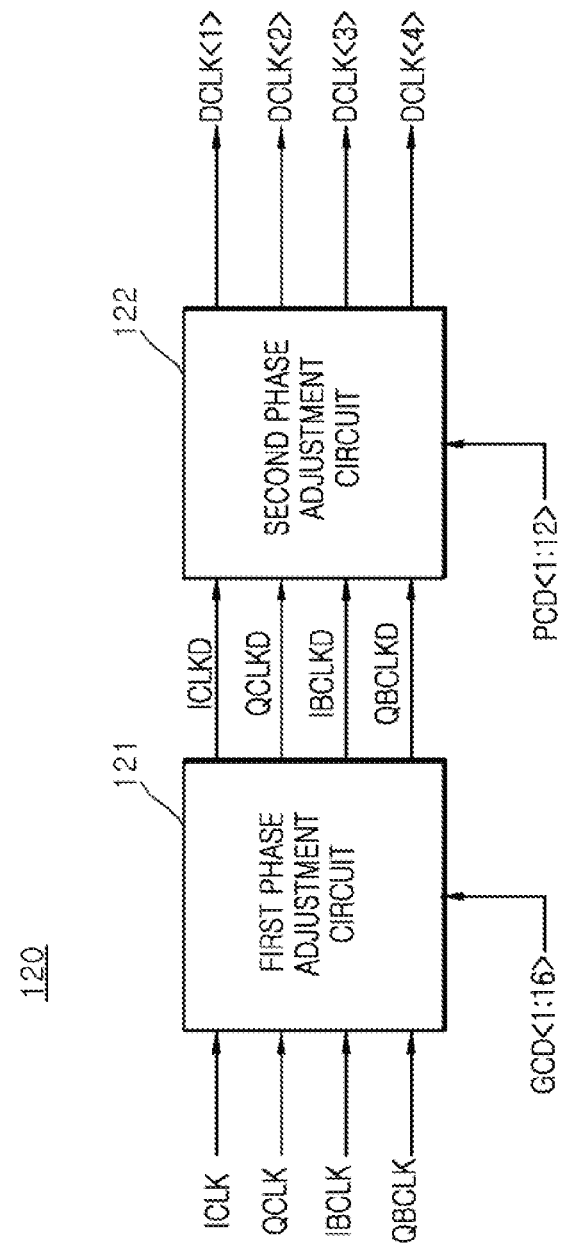
FIG. 4 is a block diagram illustrating a configuration of a phase adjustment circuit included in the internal clock generation circuit of FIG. 3.

FIG. 4 is a block diagram illustrating a configuration of the phase adjustment circuit 120. As illustrated in FIG. 4, the phase adjustment circuit 120 may include a first phase adjustment circuit 121 and a second phase adjustment circuit 122.

The first phase adjustment circuit 121 may delay the first to fourth division clock signals ICLK, QCLK, IBCLK, and QBCLK by a first delay time adjusted according to the first code signal GCD<1:16> to generate a first delay clock signal ICLKD, a second delay clock signal QCLKD, a third delay clock signal IBCLKD, and a fourth delay clock signal QBCLKD.

The second phase adjustment circuit 122 may delay the first to fourth delay clock signals ICLKD, QCLKD, IBCLKD, and QBCLKD by a second delay time adjusted according to the second code signal PCD<1:12> to generate the first to fourth internal clock signals DCLK<1:4>.

Figure 5:
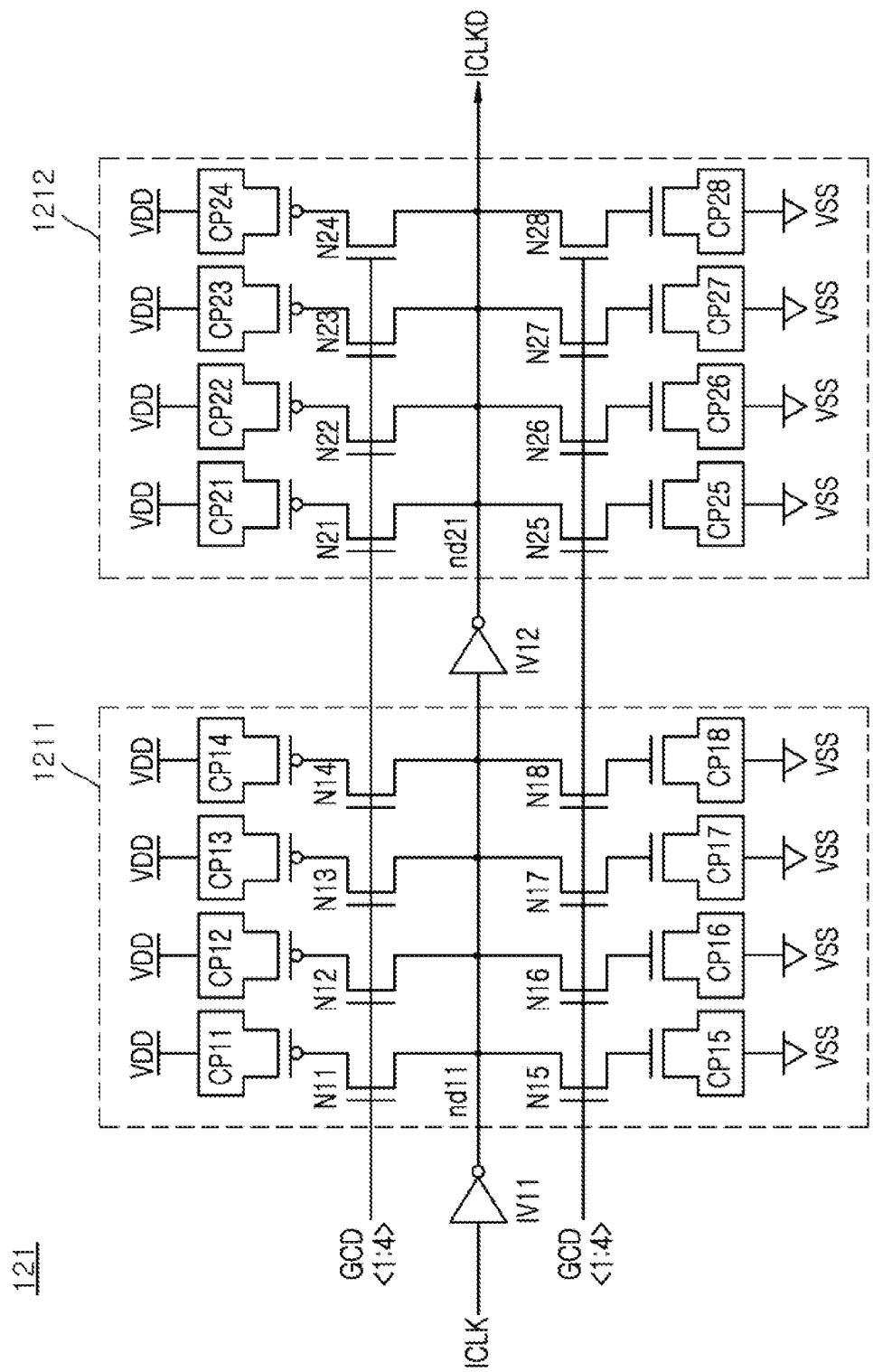
FIG. 5 is a circuit diagram illustrating a configuration of a first phase adjustment circuit included in the phase adjustment circuit of FIG. 4.

FIG. 5 is a circuit diagram illustrating a configuration of the first phase adjustment circuit 121. As illustrated in FIG. 5, the first phase adjustment circuit 121 may include a first buffer IV11, a first delay time adjustment circuit 1211, a second buffer IV12, and a second delay time adjustment circuit 1212.

The first buffer IV11 may inversely buffer the first division clock signal ICLK to output the inversely buffered signal of the first division clock signal ICLK to a node nd11.

The first delay time adjustment circuit 1211 may be realized using a plurality of switches N11, N12, N13, N14, N15, N16, N17, and N18; a plurality of PMOS-type capacitors CP11, CP12, CP13, and CP14; and a plurality of NMOS-type capacitors CP15, CP16, CP17, and CP18. The first delay time adjustment circuit 1211 may turn on the switches N11 and N15 to connect the node nd11 to the PMOS-type capacitor CP11 and the NMOS-type capacitor CP15 when a first bit GCD<1> of the first code signal GCD is enabled to have a logic "high" level. The first delay time adjustment circuit 1211 may turn on the switches N12 and N16 to connect the node nd11 to the PMOS-type capacitor CP12 and the NMOS-type capacitor CP16 when a second bit GCD<2> of the first code signal GCD is enabled to have a logic "high" level. The first delay time adjustment circuit 1211 may turn on the switches N13 and N17 to connect the node nd11 to the PMOS-type capacitor CP13 and the NMOS-type capacitor CP17 when a third bit GCD<3> of the first code signal GCD is enabled to have a logic "high" level. The first delay time adjustment circuit 1211 may turn on the switches N14 and N18 to connect the node nd11 to the PMOS-type capacitor CP14 and the NMOS-type capacitor CP18 when a fourth bit GCD<4> of the first code signal GCD is enabled to have a logic "high" level. The first delay time adjustment circuit 1211 may adjust a delay time of the first delay time adjustment circuit 1211 by selectively connecting the capacitors CP11-CP18 to the node nd11 according to logic levels of the first to fourth bits GCD<1:4> of the first code signal GCD.

The second buffer IV21 may inversely buffer a signal of the node nd11 to output the inversely buffered signal of the signal of the node nd11 to a node nd21.

The second delay time adjustment circuit 1212 may be realized using a plurality of switches N21, N22, N23, N24, N25, N26, N27, and N28; a plurality of PMOS-type capacitors CP21, CP22, CP23, and CP24; and a plurality of NMOS-type capacitors CP25, CP26, CP27, and CP28. The second delay time adjustment circuit 1212 may turn on the switches N21 and N25 to connect the node nd21 to the PMOS-type capacitor CP21 and the NMOS-type capacitor CP25 when a first bit GCD<1> of the first code signal GCD is enabled to have a logic "high" level. The second delay time adjustment circuit 1212 may turn on the switches N22 and N26 to connect the node nd21 to the PMOS-type capacitor CP22 and the NMOS-type capacitor CP26 when a second bit GCD<2> of the first code signal GCD is enabled to have a logic "high" level. The second delay time adjustment circuit 1212 may turn on the switches N23 and N27 to connect the node nd21 to the PMOS-type capacitor CP23 and the NMOS-type capacitor CP27 when a third bit GCD<3> of the first code signal GCD is enabled to have a logic "high" level. The second delay time adjustment circuit 1212 may turn on the switches N24 and N28 to connect the node nd21 to the PMOS-type capacitor CP24 and the NMOS-type capacitor CP28 when a fourth bit GCD<4> of the first code signal GCD is enabled to have a logic "high" level. The second delay time adjustment circuit 1212 may adjust a delay time of the second delay time adjustment circuit 1212 by selectively connecting the capacitors CP21-CP28 to the node nd21 according to logic levels of the first to fourth bits GCD<1:4> of the first code signal GCD.

The first delay time corresponding to a delay time of the first phase adjustment circuit 121 may be set as a sum of the delay time of the first delay time adjustment circuit 1211 and the delay time of the second delay time adjustment circuit 1212, which are set according to logic levels of the first to fourth bits GCD<1:4> of the first code signal GCD.

Meanwhile, although the first phase adjustment circuit 121 of FIG. 5 is illustrated to generate the first delay clock signal ICLKD by delaying the first division clock signal ICLK for the purpose of ease and convenience in explanation, the first phase adjustment circuit 121 may be realized to further include additional circuits for generating the second, third, and fourth delay clock signals QCLKD, IBCLKD, and QBCLKD by delaying the second, third, and fourth division clock signals QCLK, IBCLK, and QBCLK.

Figure 6:
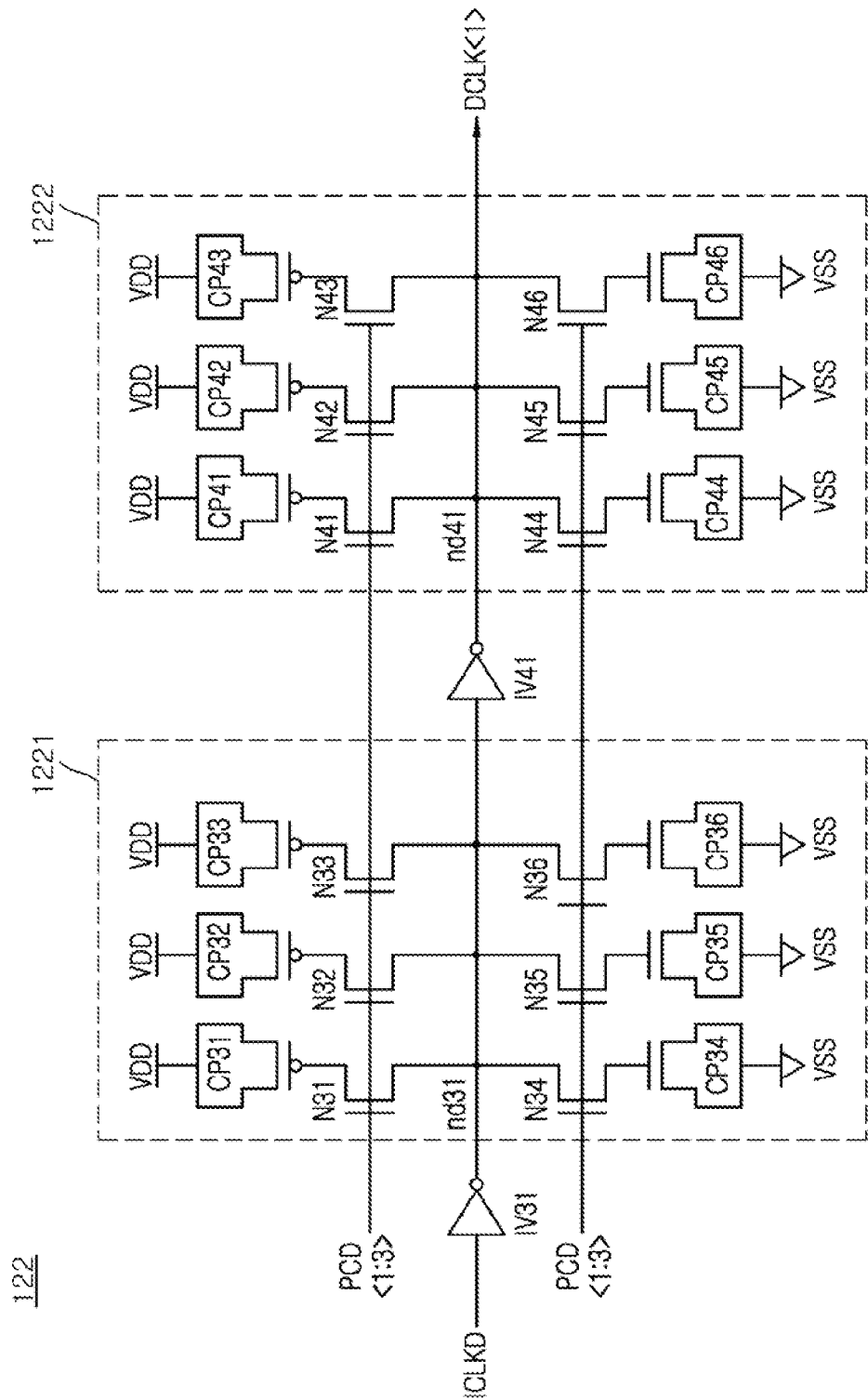
FIG. 6 is a circuit diagram illustrating a configuration of a second phase adjustment circuit included in the phase adjustment circuit of FIG. 4.

FIG. 6 is a circuit diagram illustrating a configuration of the second phase adjustment circuit 122. As illustrated in FIG. 6, the second phase adjustment circuit 122 may include a third buffer IV31, a third delay time adjustment circuit 1221, a fourth buffer IV41, and a fourth delay time adjustment circuit 1222.

The third buffer IV31 may inversely buffer the first delay clock signal ICLKD to output the inversely buffered signal of the first delay clock signal ICLKD to a node nd31.

The third delay time adjustment circuit 1221 may be realized using a plurality of switches N31, N32, N33, N34, N35, and N36, a plurality of PMOS-type capacitors CP31, CP32, and CP33, and a plurality of NMOS-type capacitors CP34, CP35, and CP36. The third delay time adjustment circuit 1221 may turn on the switches N31 and N34 to connect the node nd31 to the PMOS-type capacitor CP31 and the NMOS-type capacitor CP34 when a first bit PCD<1> of the second code signal PCD is enabled to have a logic "high" level. The third delay time adjustment circuit 1221 may turn on the switches N32 and N35 to connect the node nd31 to the PMOS-type capacitor CP32 and the NMOS-type capacitor CP35 when a second bit PCD<2> of the second code signal PCD is enabled to have a logic "high" level. The third delay time adjustment circuit 1221 may turn on the switches N33 and N36 to connect the node nd31 to the PMOS-type capacitor CP33 and the NMOS-type capacitor CP36 when a third bit PCD<3> of the second code signal PCD is enabled to have a logic "high" level. The third delay time adjustment circuit 1221 may adjust a delay time of the third delay time adjustment circuit 1221 by selectively connecting the capacitors CP31-CP36 to the node nd31 according to logic levels of the first to third bits PCD<1:3> of the second code signal PCD.

The fourth buffer IV41 may inversely buffer a signal of the node nd31 to output the inversely buffered signal of the signal of the node nd31 to a node nd41.

The fourth delay time adjustment circuit 1222 may be realized using a plurality of switches N41, N42, N43, N44, N45, and N46; a plurality of PMOS-type capacitors CP41, CP42, and CP43; and a plurality of NMOS-type capacitors CP44, CP45, and CP46. The fourth delay time adjustment circuit 1222 may turn on the switches N41 and N44 to connect the node nd41 to the PMOS-type capacitor CP41 and the NMOS-type capacitor CP44 when a first bit PCD<1> of the second code signal PCD is enabled to have a logic "high" level. The fourth delay time adjustment circuit 1222 may turn on the switches N42 and N45 to connect the node nd41 to the PMOS-type capacitor CP42 and the NMOS-type capacitor CP45 when a second bit PCD<2> of the second code signal PCD is enabled to have a logic "high" level. The fourth delay time adjustment circuit 1222 may turn on the switches N43 and N46 to connect the node nd41 to the PMOS-type capacitor CP43 and the NMOS-type capacitor CP46 when a third bit PCD<3> of the second code signal PCD is enabled to have a logic "high" level. The fourth delay time adjustment circuit 1222 may adjust a delay time of the fourth delay time adjustment circuit 1222 by selectively connecting the capacitors CP41-CP46 to the node nd41 according to logic levels of the first to third bits PCD<1:3> of the second code signal PCD.

The second delay time corresponding to a delay time of the second phase adjustment circuit 122 may be set as a sum of the delay time of the third delay time adjustment circuit 1221 and the delay time of the fourth delay time adjustment circuit 1222, which are set according to logic levels of the first to third bits PCD<1:4> of the second code signal PCD.

Meanwhile, although the second phase adjustment circuit 122 of FIG. 6 is illustrated to generate the first internal clock signal DCLK<1> by delaying the first delay clock signal ICLKD for the purpose of ease and convenience in explanation, the second phase adjustment circuit 122 may be realized to further include additional circuits for generating the second, third, and fourth internal clock signals DCLK<2>, DCLK<3>, and DCLK<4> by delaying the second, third, and fourth delay clock signals QCLKD, IBCLKD, and QBCLKD.

Figure 7:
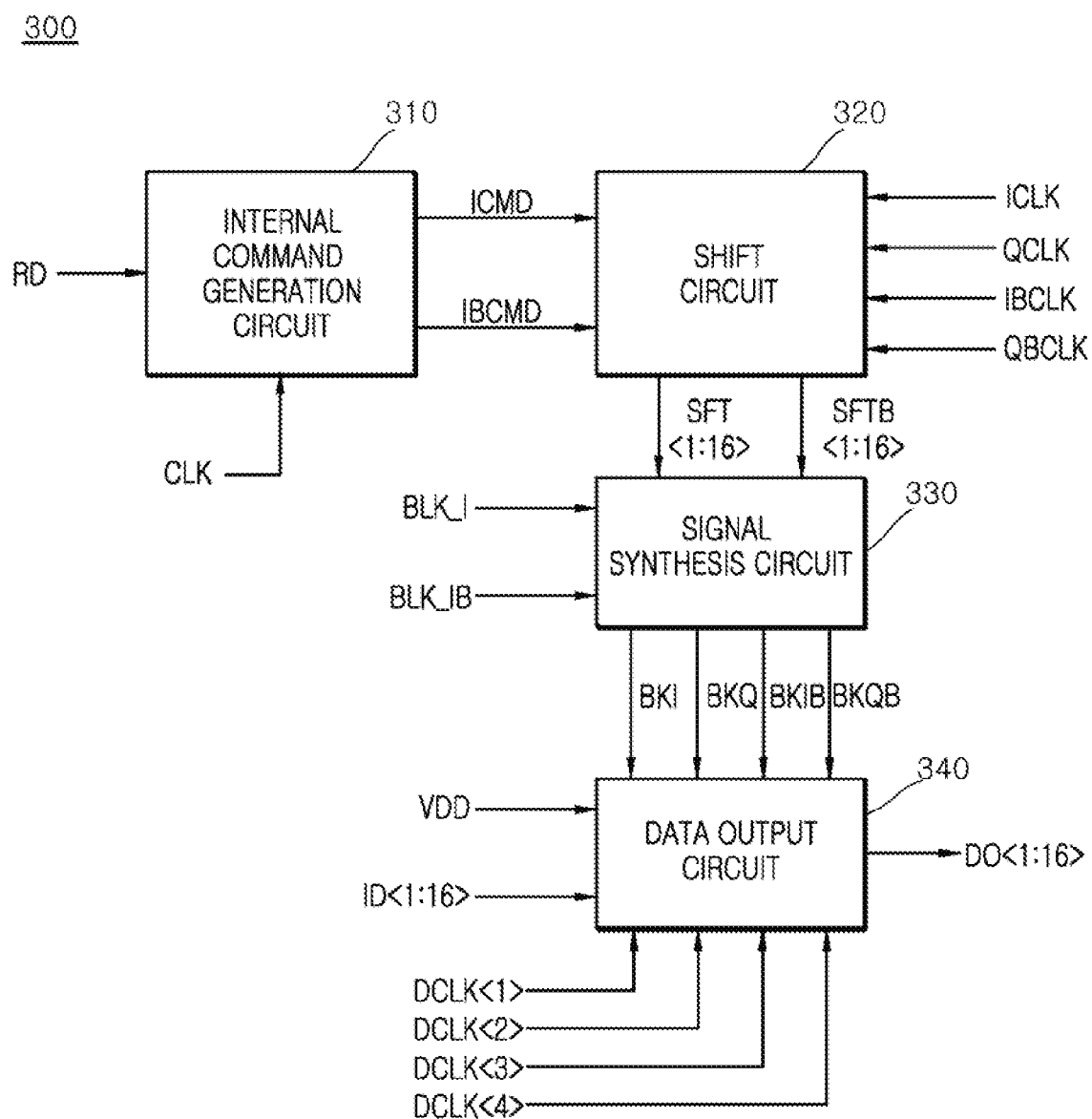
FIG. 7 is a block diagram illustrating a configuration of a data processing circuit included in the semiconductor system of FIG. 1.

FIG. 7 is a block diagram illustrating a configuration of the data processing circuit 300. As illustrated in FIG. 7, the data processing circuit 300 may include an internal command generation circuit 310, a shift circuit 320, a signal synthesis circuit 330, and a data output circuit 340.

The internal command generation circuit 310 may be synchronized with the clock signal CLK to generate a first internal command ICMD and a second internal command IBCMD, one of which is selectively enabled according to a point in time when the read command RD is inputted to the internal command generation circuit 310. The internal command generation circuit 310 may generate the first internal command ICMD which is enabled when the read command RD is inputted in synchronization with a rising edge of the clock signal CLK. The internal command generation circuit 310 may generate the second internal command IBCMD which is enabled when the read command RD is inputted in synchronization with a falling edge of the clock signal CLK.

The shift circuit 320 may shift the first internal command ICMD and the second internal command IBCMD in synchronization with the first division clock signal ICLK, the second division clock signal QCLK, the third division clock signal IBCLK, and the fourth division clock signal QBCLK to generate a first shifted signal SFT<1:16> and a second shifted signal SFTB<1:16>. The shift circuit 320 may shift the first internal command ICMD in synchronization with the first division clock signal ICLK and the fourth division clock signal QBCLK to generate the first shifted signal SFT<1:16>. The shift circuit 320 may shift the second internal command IBCMD in synchronization with the second division clock signal QCLK and the third division clock signal IBCLK to generate the second shifted signal SFTB<1:16>.

The signal synthesis circuit 330 may synthesize the first and second shifted signals SFT<1:16> and SFTB<1:16> based on the first and second command blocking signals BLK_I and BLK_IB to generate a first data blocking signal BKI, a second data blocking signal BKQ, a third data blocking signal BKIB, and a fourth data blocking signal BKQB. The signal synthesis circuit 330 may synthesize some bits of the first and second shifted signals SFT<1:16> and SFTB<1:16> based on the first and second command blocking signals BLK_I and BLK_IB and may generate the first to fourth data blocking signals BKI, BKQ, BKIB, and BKQB from the synthesized result.

The data output circuit 340 may be synchronized with the first to fourth internal clock signals DCLK<1:4> to generate the output data DO<1:16> from the internal data ID<1:16>. The data output circuit 340 may align the internal data ID<1:16> in synchronization with the first to fourth internal clock signals DCLK<1:4> to generate the output data DO<1:16>. The data output circuit 340 may generate the output data DO<1:16> from the power supply voltage VDD based on the first to fourth data blocking signals BKI, BKQ, BKIB, and BKQB.

Figure 8:
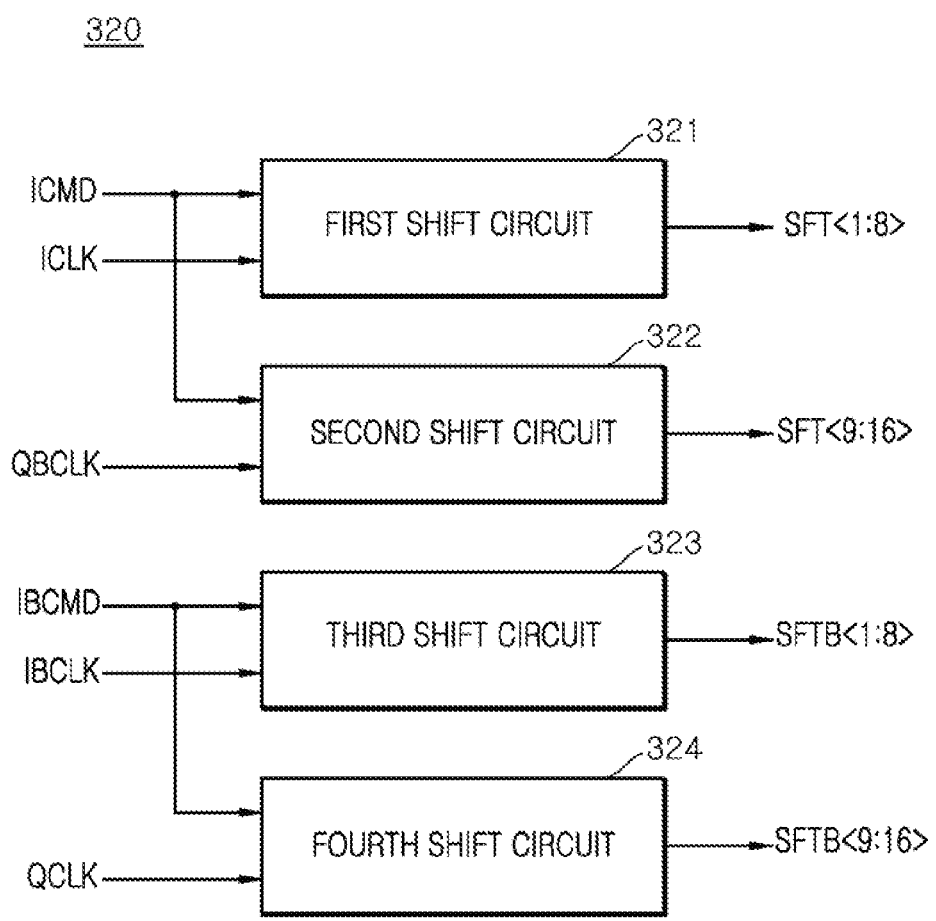
FIG. 8 is a block diagram illustrating a configuration of a shift circuit included in the data processing circuit of FIG. 7.

FIG. 8 is a block diagram illustrating a configuration of the shift circuit 320. As illustrated in FIG. 8, the shift circuit 320 may include a first shift circuit 321, a second shift circuit 322, a third shift circuit 323, and a fourth shift circuit 324.

The first shift circuit 321 may shift the first internal command ICMD in synchronization with the first division clock signal ICLK to generate first to eighth bit signals SFT<1:8> of the first shifted signal SFT<1:16>. The first shift circuit 321 may sequentially shift the first internal command ICMD in units of half cycles of the first division clock signal ICLK to generate the first to eighth bit signals SFT<1:8> of the first shifted signal SFT<1:16>.

The second shift circuit 322 may shift the first internal command ICMD in synchronization with the fourth division clock signal QBCLK to generate ninth to sixteenth bit signals SFT<9:16> of the first shifted signal SFT<1:16>. The second shift circuit 322 may sequentially shift the first internal command ICMD in units of half cycles of the fourth division clock signal QBCLK to generate the ninth to sixteenth bit signals SFT<9:16> of the first shifted signal SFT<1:16>.

The third shift circuit 323 may shift the second internal command IBCMD in synchronization with the third division clock signal IBCLK to generate first to eighth bit signals SFTB<1:8> of the second shifted signal SFTB<1:16>. The third shift circuit 323 may sequentially shift the second internal command IBCMD in units of half cycles of the third division clock signal IBCLK to generate the first to eighth bit signals SFTB<1:8> of the second shifted signal SFTB<1:16>.

The fourth shift circuit 324 may shift the second internal command IBCMD in synchronization with the second division clock signal QCLK to generate ninth to sixteenth bit signals SFTB<9:16> of the second shifted signal SFTB<1:16>. The fourth shift circuit 324 may sequentially shift the second internal command IBCMD in units of half cycles of the second division clock signal QCLK to generate the ninth to sixteenth bit signals SFTB<9:16> of the second shifted signal SFTB<1:16>.

Figure 9:
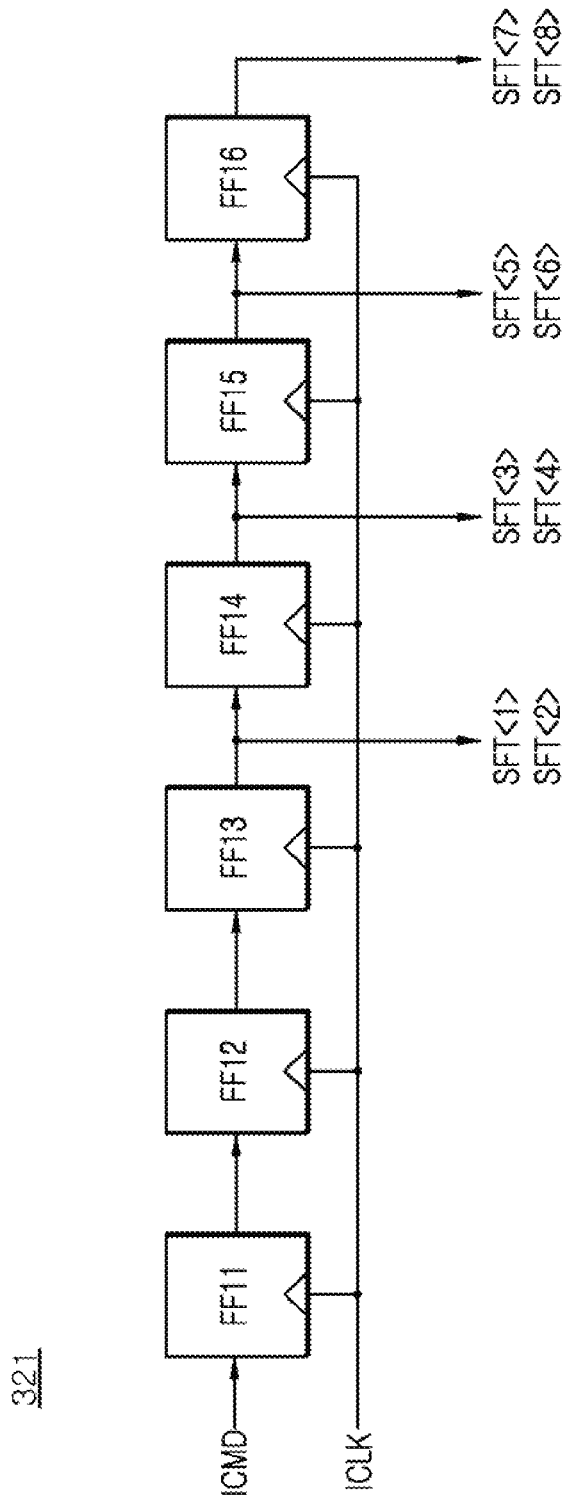
FIG. 9 illustrates a configuration of a first shift circuit included in the shift circuit of FIG. 8.

FIG. 9 illustrates a configuration of the first shift circuit 321. As illustrated in FIG. 9, the first shift circuit 321 may be realized using a plurality of flip-flops FF11, FF12, FF13, FF14, FF15, and FF16 which are coupled in series.

The flip-flop FF11 may shift the first internal command ICMD by one cycle of the first division clock signal ICLK to output the shifted command of the first internal command ICMD.

The flip-flop FF12 may shift an output signal of the flip-flop FF11 by one cycle of the first division clock signal ICLK to output the shifted signal of the output signal of the flip-flop FF11.

The flip-flop FF13 may shift an output signal of the flip-flop FF12 by a half cycle of the first division clock signal ICLK to generate the first bit signal SFT<1> of the first shifted signal SFT<1:16>. The flip-flop FF13 may shift the first bit signal SFT<1> of the first shifted signal SFT<1:16> by a half cycle of the first division clock signal ICLK to generate the second bit signal SFT<2> of the first shifted signal SFT<1:16>.

The flip-flop FF14 may shift the second bit signal SFT<2> of the first shifted signal SFT<1:16> by a half cycle of the first division clock signal ICLK to generate the third bit signal SFT<3> of the first shifted signal SFT<1:16>. The flip-flop FF14 may shift the third bit signal SFT<3> of the first shifted signal SFT<1:16> by a half cycle of the first division clock signal ICLK to generate the fourth bit signal SFT<4> of the first shifted signal SFT<1:16>.

The flip-flop FF15 may shift the fourth bit signal SFT<4> of the first shifted signal SFT<1:16> by a half cycle of the first division clock signal ICLK to generate the fifth bit signal SFT<5> of the first shifted signal SFT<1:16>. The flip-flop FF15 may shift the fifth bit signal SFT<5> of the first shifted signal SFT<1:16> by a half cycle of the first division clock signal ICLK to generate the sixth bit signal SFT<6> of the first shifted signal SFT<1:16>.

The flip-flop FF16 may shift the sixth bit signal SFT<6> of the first shifted signal SFT<1:16> by a half cycle of the first division clock signal ICLK to generate the seventh bit signal SFT<7> of the first shifted signal SFT<1:16>. The flip-flop FF16 may shift the seventh bit signal SFT<7> of the first shifted signal SFT<1:16> by a half cycle of the first division clock signal ICLK to generate the eighth bit signal SFT<8> of the first shifted signal SFT<1:16>.

Although FIG. 9 illustrates an example in which the first shift circuit 321 is realized using the six flip-flops FF11, FF12, FF13, FF14, FF15, and FF16 coupled in series, the number of flip-flops included in the first shift circuit 321 is not limited to six. For example, in some embodiments, the first shift circuit 321 may be configured to include five or less flip-flops coupled in series or to include seven or more flip-flops coupled in series.

Figure 10:
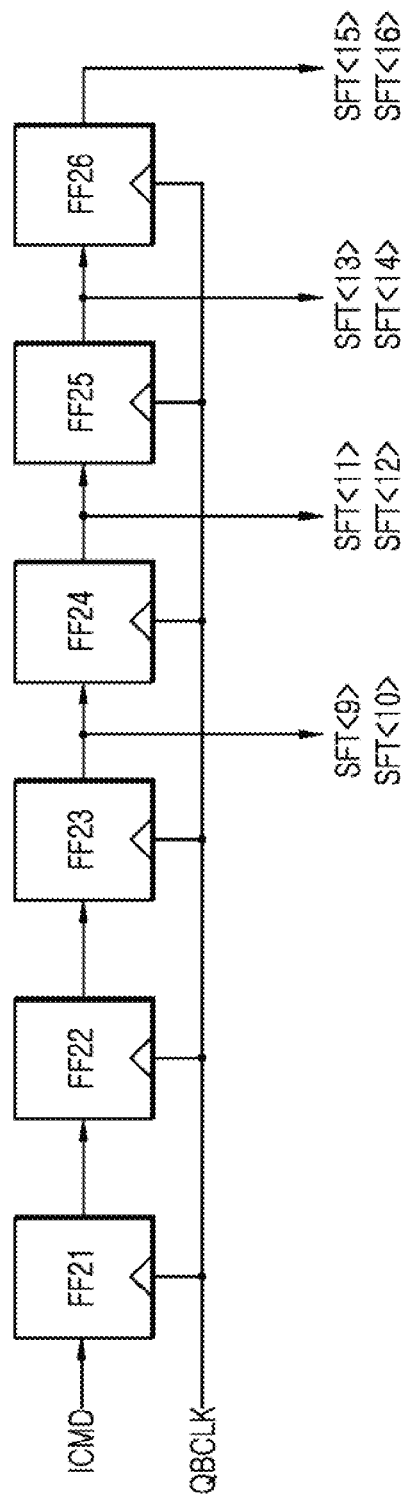
FIG. 10 illustrates a configuration of a second shift circuit included in the shift circuit of FIG. 8.

FIG. 10 illustrates a configuration of the second shift circuit 322. As illustrated in FIG. 10, the second shift circuit 322 may be realized using a plurality of flip-flops FF21, FF22, FF23, FF24, FF25, and FF26 which are coupled in series.

The flip-flop FF21 may shift the first internal command ICMD by one cycle of the fourth division clock signal QBCLK to output the shifted command of the first internal command ICMD.

The flip-flop FF22 may shift an output signal of the flip-flop FF21 by one cycle of the fourth division clock signal QBCLK to output the shifted signal of the output signal of the flip-flop FF21.

The flip-flop FF23 may shift an output signal of the flip-flop FF22 by a half cycle of the fourth division clock signal QBCLK to generate the ninth bit signal SFT<9> of the first shifted signal SFT<1:16>. The flip-flop FF23 may shift the ninth bit signal SFT<9> of the first shifted signal SFT<1:16> by a half cycle of the fourth division clock signal QBCLK to generate the tenth bit signal SFT<10> of the first shifted signal SFT<1:16>.

The flip-flop FF24 may shift the tenth bit signal SFT<10> of the first shifted signal SFT<1:16> by a half cycle of the fourth division clock signal QBCLK to generate the eleventh bit signal SFT<11> of the first shifted signal SFT<1:16>. The flip-flop FF24 may shift the eleventh bit signal SFT<11> of the first shifted signal SFT<1:16> by a half cycle of the fourth division clock signal QBCLK to generate the twelfth bit signal SFT<12> of the first shifted signal SFT<1:16>.

The flip-flop FF25 may shift the twelfth bit signal SFT<12> of the first shifted signal SFT<1:16> by a half cycle of the fourth division clock signal QBCLK to generate the thirteenth bit signal SFT<13> of the first shifted signal SFT<1:16>. The flip-flop FF25 may shift the thirteenth bit signal SFT<13> of the first shifted signal SFT<1:16> by a half cycle of the fourth division clock signal QBCLK to generate the fourteenth bit signal SFT<14> of the first shifted signal SFT<1:16>.

The flip-flop FF26 may shift the fourteenth bit signal SFT<14> of the first shifted signal SFT<1:16> by a half cycle of the fourth division clock signal QBCLK to generate the fifteenth bit signal SFT<15> of the first shifted signal SFT<1:16>. The flip-flop FF26 may shift the fifteenth bit signal SFT<15> of the first shifted signal SFT<1:16> by a half cycle of the fourth division clock signal QBCLK to generate the sixteenth bit signal SFT<16> of the first shifted signal SFT<1:16>.

Although FIG. 10 illustrates an example in which the second shift circuit 322 is realized using the six flip-flops FF21, FF22, FF23, FF24, FF25, and FF26 coupled in series, the number of flip-flops included in the second shift circuit 322 is not limited to six. For example, in some embodiments, the second shift circuit 322 may be configured to include five or less flip-flops coupled in series or to include seven or more flip-flops coupled in series.

Figure 11:
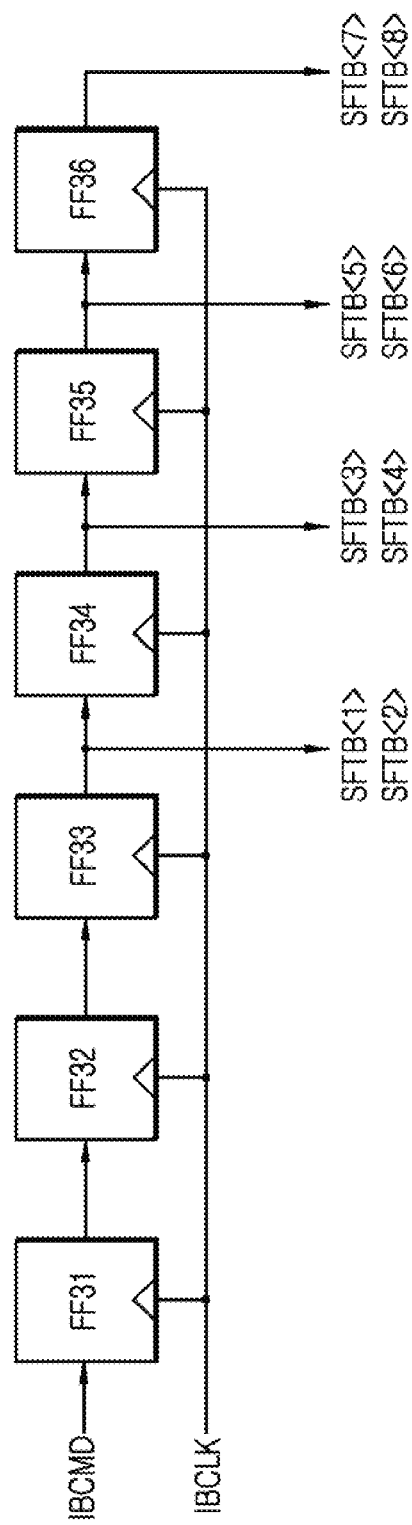
FIG. 11 illustrates a configuration of a third shift circuit included in the shift circuit of FIG. 8.

FIG. 11 illustrates a configuration of the third shift circuit 323. As illustrated in FIG. 11, the third shift circuit 323 may be realized using a plurality of flip-flops FF31, FF32, FF33, FF34, FF35, and FF36 which are coupled in series.

The flip-flop FF31 may shift the second internal command IBCMD by one cycle of the third division clock signal IBCLK to output the shifted command of the second internal command IBCMD.

The flip-flop FF32 may shift an output signal of the flip-flop FF31 by one cycle of the third division clock signal IBCLK to output the shifted signal of the output signal of the flip-flop FF31.

The flip-flop FF33 may shift an output signal of the flip-flop FF32 by a half cycle of the third division clock signal IBCLK to generate the first bit signal SFTB<1> of the second shifted signal SFTB<1:16>. The flip-flop FF33 may shift the first bit signal SFTB<1> of the second shifted signal SFTB<1:16> by a half cycle of the third division clock signal IBCLK to generate the second bit signal SFTB<2> of the second shifted signal SFTB<1:16>.

The flip-flop FF34 may shift the second bit signal SFTB<2> of the second shifted signal SFTB<1:16> by a half cycle of the third division clock signal IBCLK to generate the third bit signal SFTB<3> of the second shifted signal SFTB<1:16>. The flip-flop FF34 may shift the third bit signal SFTB<3> of the second shifted signal SFTB<1:16> by a half cycle of the third division clock signal IBCLK to generate the fourth bit signal SFTB<4> of the second shifted signal SFTB<1:16>.

The flip-flop FF35 may shift the fourth bit signal SFTB<4> of the second shifted signal SFTB<1:16> by a half cycle of the third division clock signal IBCLK to generate the fifth bit signal SFTB<5> of the second shifted signal SFTB<1:16>. The flip-flop FF35 may shift the fifth bit signal SFTB<5> of the second shifted signal SFTB<1:16> by a half cycle of the third division clock signal IBCLK to generate the sixth bit signal SFTB<6> of the second shifted signal SFTB<1:16>.

The flip-flop FF36 may shift the sixth bit signal SFTB<6> of the second shifted signal SFTB<1:16> by a half cycle of the third division clock signal IBCLK to generate the seventh bit signal SFTB<7> of the second shifted signal SFTB<1:16>. The flip-flop FF36 may shift the seventh bit signal SFTB<7> of the second shifted signal SFTB<1:16> by a half cycle of the third division clock signal IBCLK to generate the eighth bit signal SFTB<8> of the second shifted signal SFTB<1:16>.

Although FIG. 11 illustrates an example in which the third shift circuit 323 is realized using the six flip-flops FF31, FF32, FF33, FF34, FF35, and FF36 coupled in series, the number of flip-flops included in the third shift circuit 323 is not limited to six. For example, in some embodiments, the third shift circuit 323 may be configured to include five or less flip-flops coupled in series or to include seven or more flip-flops coupled in series.

Figure 12:
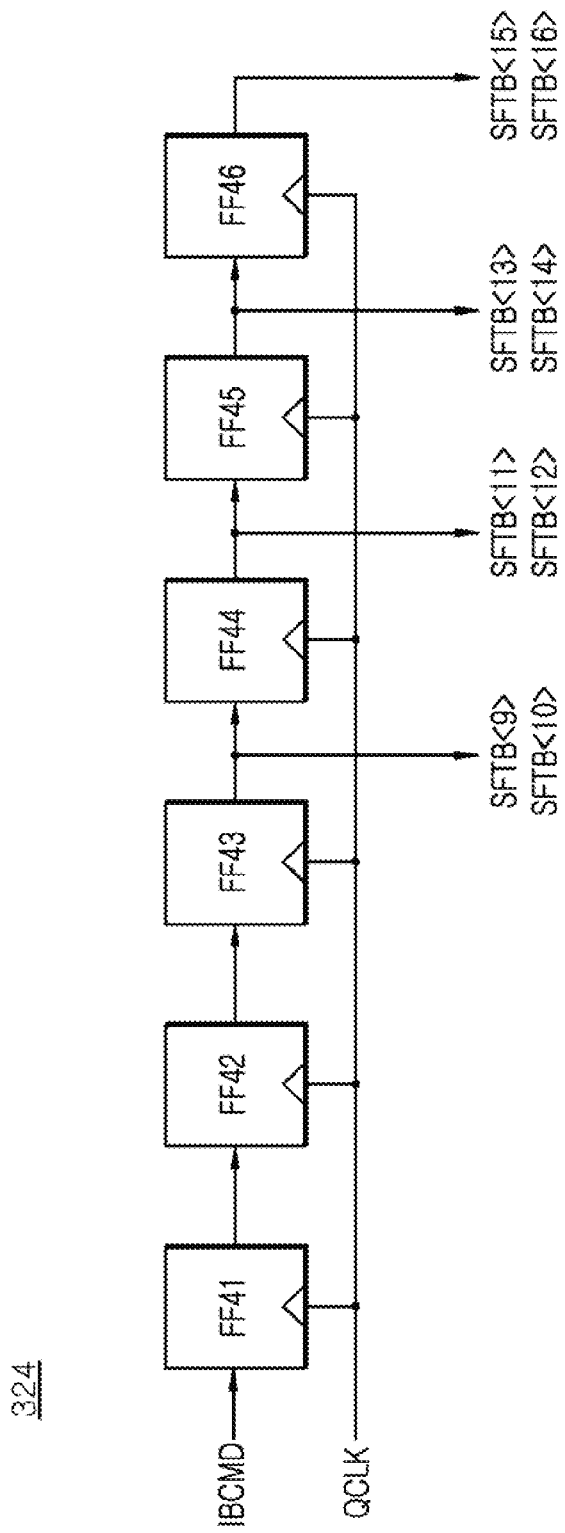
FIG. 12 illustrates a configuration of a fourth shift circuit included in the shift circuit of FIG. 8.

FIG. 12 illustrates a configuration of the fourth shift circuit 324. As illustrated in FIG. 12, the fourth shift circuit 324 may be realized using a plurality of flip-flops FF41, FF42, FF43, FF44, FF45, and FF46 which are coupled in series.

The flip-flop FF41 may shift the second internal command IBCMD by one cycle of the second division clock signal QCLK to output the shifted command of the second internal command IBCMD.

The flip-flop FF42 may shift an output signal of the flip-flop FF41 by one cycle of the second division clock signal QCLK to output the shifted signal of the output signal of the flip-flop FF41.

The flip-flop FF43 may shift an output signal of the flip-flop FF42 by a half cycle of the second division clock signal QCLK to generate the ninth bit signal SFTB<9> of the second shifted signal SFTB<1:16>. The flip-flop FF43 may shift the ninth bit signal SFTB<9> of the second shifted signal SFTB<1:16> by a half cycle of the second division clock signal QCLK to generate the tenth bit signal SFTB<10> of the second shifted signal SFTB<1:16>.

The flip-flop FF44 may shift the tenth bit signal SFTB<10> of the second shifted signal SFTB<1:16> by a half cycle of the second division clock signal QCLK to generate the eleventh bit signal SFTB<11> of the second shifted signal SFTB<1:16>. The flip-flop FF44 may shift the eleventh bit signal SFTB<11> of the second shifted signal SFTB<1:16> by a half cycle of the second division clock signal QCLK to generate the twelfth bit signal SFTB<12> of the second shifted signal SFTB<1:16>.

The flip-flop FF45 may shift the twelfth bit signal SFTB<12> of the second shifted signal SFTB<1:16> by a half cycle of the second division clock signal QCLK to generate the thirteenth bit signal SFTB<13> of the second shifted signal SFTB<1:16>. The flip-flop FF45 may shift the thirteenth bit signal SFTB<13> of the second shifted signal SFTB<1:16> by a half cycle of the second division clock signal QCLK to generate the fourteenth bit signal SFTB<14> of the second shifted signal SFTB<1:16>.

The flip-flop FF46 may shift the fourteenth bit signal SFTB<14> of the second shifted signal SFTB<1:16> by a half cycle of the second division clock signal QCLK to generate the fifteenth bit signal SFTB<15> of the second shifted signal SFTB<1:16>. The flip-flop FF46 may shift the fifteenth bit signal SFTB<15> of the second shifted signal SFTB<1:16> by a half cycle of the second division clock signal QCLK to generate the sixteenth bit signal SFTB<16> of the second shifted signal SFTB<1:16>.

Although FIG. 12 illustrates an example in which the fourth shift circuit 324 is realized using the six flip-flops FF41, FF42, FF43, FF44, FF45, and FF46 coupled in series, the number of flip-flops included in the fourth shift circuit 324 is not limited to six. For example, in some embodiments, the fourth shift circuit 324 may be configured to include five or less flip-flops coupled in series or to include seven or more flip-flops coupled in series.

Figure 13:
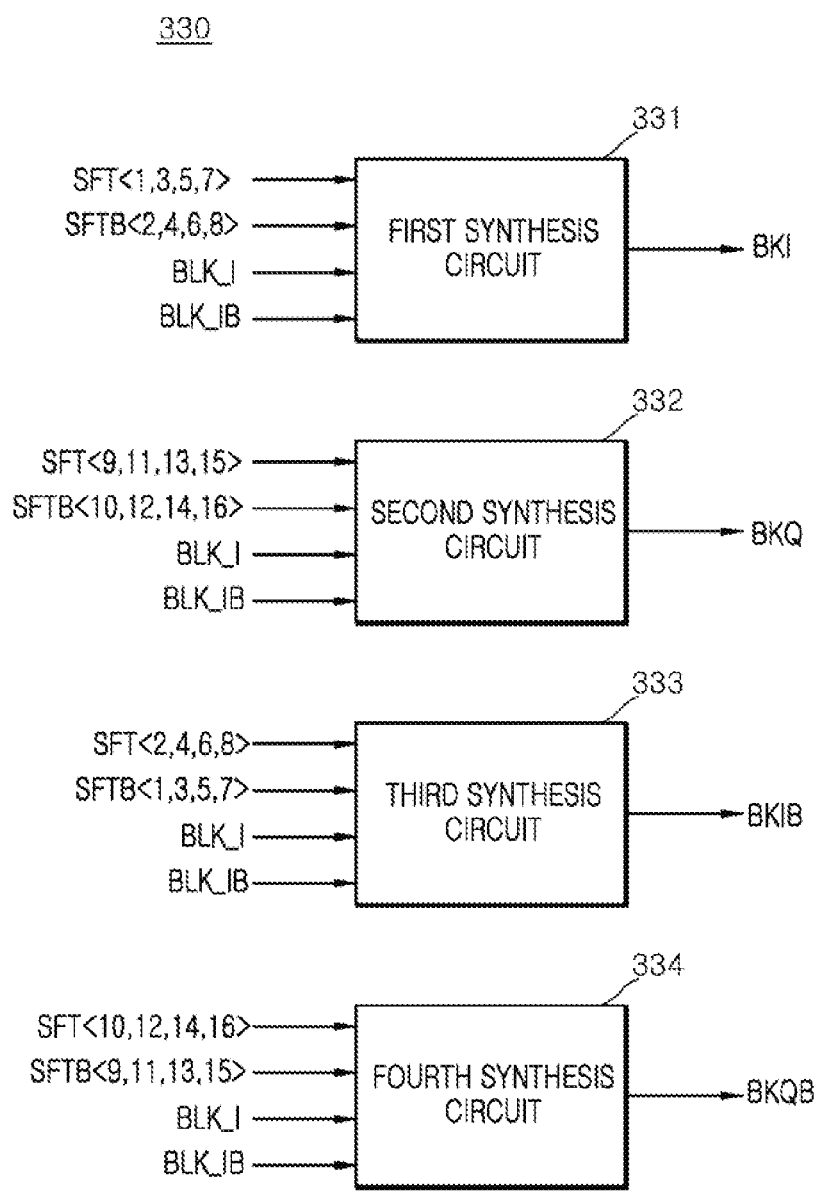
FIG. 13 is a block diagram illustrating a configuration of a signal synthesis circuit included in the data processing circuit of FIG. 7.

FIG. 13 is a block diagram illustrating a configuration of the signal synthesis circuit 330. As illustrated in FIG. 13, the signal synthesis circuit 330 may include a first synthesis circuit 331, a second synthesis circuit 332, a third synthesis circuit 333, and a fourth synthesis circuit 334.

The first synthesis circuit 331 may synthesize a first group SFT<1, 3, 5, and 7> of the first shifted signal SFT<1:16> and a first group SFTB<2, 4, 6, and 8> of the second shifted signal SFTB<1:16>. The first synthesis circuit 331 may generate the first data blocking signal BKI from the synthesized result based on the first command blocking signal BLK_I and the second command blocking signal BLK_IB.

The second synthesis circuit 332 may synthesize a second group SFT<9, 11, 13, and 15> of the first shifted signal SFT<1:16> and a second group SFTB<10, 12, 14, and 16> of the second shifted signal SFTB<1:16>. The second synthesis circuit 332 may generate the second data blocking signal BKQ from the synthesized result based on the first command blocking signal BLK_I and the second command blocking signal BLK_IB.

The third synthesis circuit 333 may synthesize a third group SFT<2, 4, 6, and 8> of the first shifted signal SFT<1:16> and a third group SFTB<1, 3, 5, and 7> of the second shifted signal SFTB<1:16>. The third synthesis circuit 333 may generate the third data blocking signal BKIB from the synthesized result based on the first command blocking signal BLK_I and the second command blocking signal BLK_IB.

The fourth synthesis circuit 334 may synthesize a fourth group SFT<10, 12, 14, and 16> of the first shifted signal SFT<1:16> and a fourth group SFTB<9, 11, 13, and 15> of the second shifted signal SFTB<1:16>. The fourth synthesis circuit 334 may generate the fourth data blocking signal BKQB from the synthesized result based on the first command blocking signal BLK_I and the second command blocking signal BLK_IB.

In some other embodiments, the first shifted signal SFT<1:16> may be set to include first to fourth groups which are different from the first to fourth groups SFT<1, 3, 5, and 7>, SFT<9, 11, 13, and 15>, SFT<2, 4, 6, and 8>, and SFT<10, 12, 14, and 16> of the first shifted signal SFT<1:16>. The second shifted signal SFTB<1:16> may also be set to include first to fourth groups which are different from the first to fourth groups SFTB<2, 4, 6, and 8>, SFT<10, 12, 14, and 16>, SFT<1, 3, 5, and 7>, and SFT<9, 11, 13, and 15> of the first shifted signal SFT<1:16>.

Figure 14:
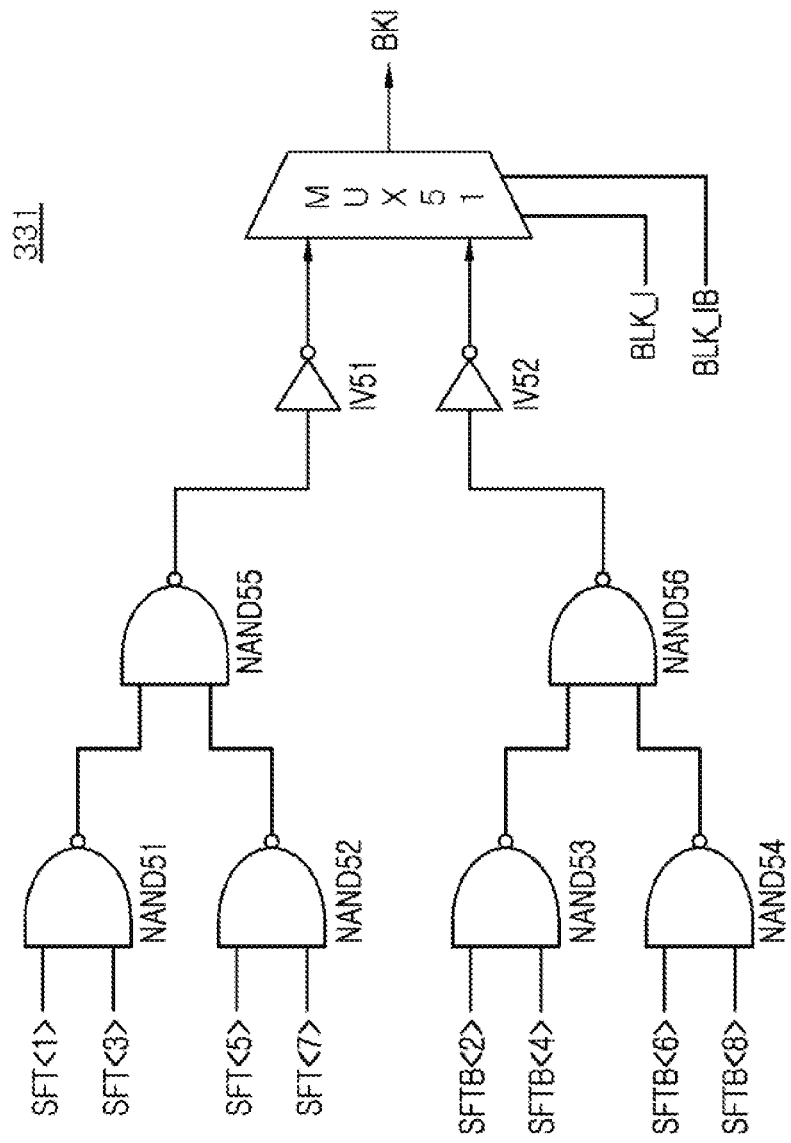
FIG. 14 illustrates a configuration of a first synthesis circuit included in the signal synthesis circuit of FIG. 13.

FIG. 14 illustrates a configuration of the first synthesis circuit 331. As illustrated in FIG. 14, the first synthesis circuit 331 may be realized using NAND gates NAND51, NAND52, NAND53, NAND54, NAND55, and NAND56; inverters IV51 and IV52; and a multiplexer MUX51.

The first synthesis circuit 331 may synthesize the first group SFT<1, 3, 5, and 7> of the first shifted signal SFT<1:16> and may generate the first data blocking signal BKI from the synthesized result of the first group SFT<1, 3, 5, and 7> of the first shifted signal SFT<1:16> when the first command blocking signal BLK_I is enabled to have a logic "high" level. The first synthesis circuit 331 may generate the first data blocking signal BKI having a logic "high" level when the first command blocking signal BLK_I is enabled to have a logic "high" level while all of the first group SFT<1, 3, 5, and 7> of the first shifted signal SFT<1:16> have a logic "low" level.

The first synthesis circuit 331 may synthesize the first group SFTB<2, 4, 6, and 8> of the second shifted signal SFTB<1:16> and may generate the first data blocking signal BKI from the synthesized result of the first group SFTB<2, 4, 6, and 8> of the second shifted signal SFTB<1:16> when the second command blocking signal BLK_IB is enabled to have a logic "high" level. The first synthesis circuit 331 may generate the first data blocking signal BKI having a logic "high" level when the second command blocking signal BLK_IB is enabled to have a logic "high" level while all of the first group SFTB<2, 4, 6, and 8> of the second shifted signal SFTB<1:16> have a logic "low" level.

Figure 15:
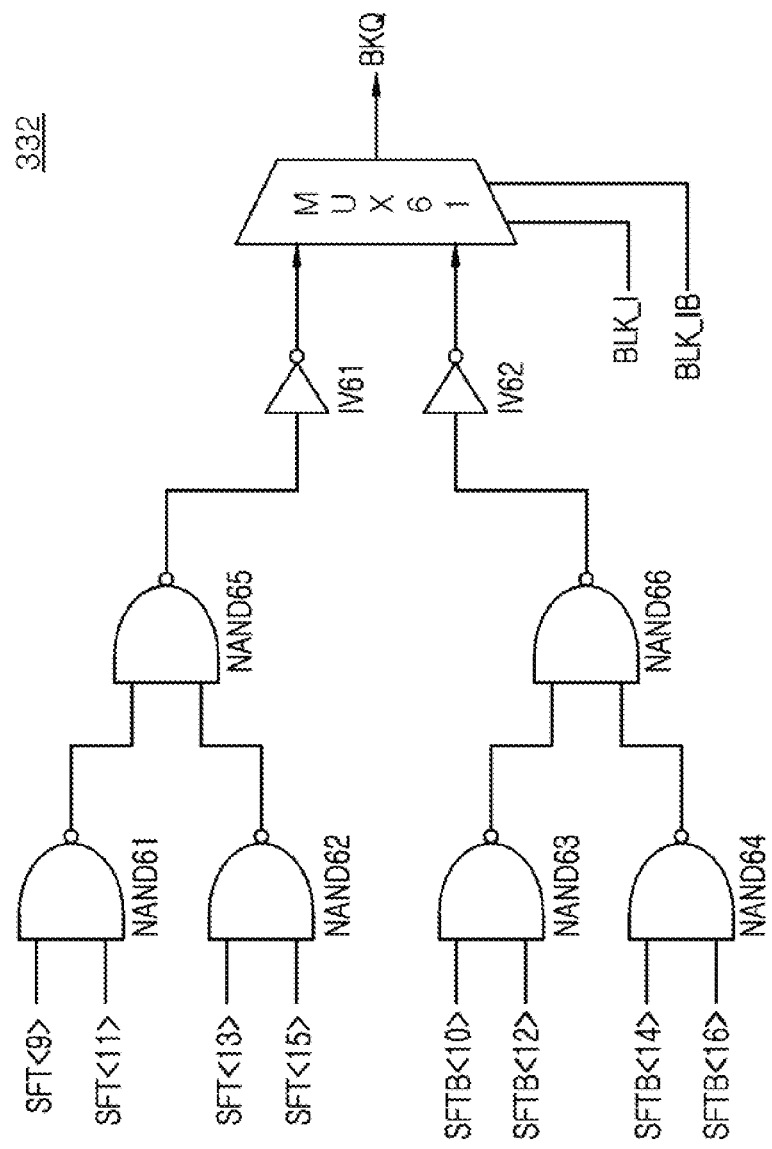
FIG. 15 illustrates a configuration of a second synthesis circuit included in the signal synthesis circuit of FIG. 13.

FIG. 15 illustrates a configuration of the second synthesis circuit 332. As illustrated in FIG. 15, the second synthesis circuit 332 may be realized using NAND gates NAND61, NAND62, NAND63, NAND64, NAND65, and NAND66; inverters IV61 and IV62; and a multiplexer MUX61.

The second synthesis circuit 332 may synthesize the second group SFT<9, 11, 13, and 15> of the first shifted signal SFT<1:16> and may generate the second data blocking signal BKQ from the synthesized result of the second group SFT<9, 11, 13, and 15> of the first shifted signal SFT<1:16> when the first command blocking signal BLK_I is enabled to have a logic "high" level. The second synthesis circuit 332 may generate the second data blocking signal BKQ having a logic "high" level when the first command blocking signal BLK_I is enabled to have a logic "high" level while all of the second group SFT<9, 11, 13, and 15> of the first shifted signal SFT<1:16> have a logic "low" level.

The second synthesis circuit 332 may synthesize the second group SFTB<10, 12, 14, and 16> of the second shifted signal SFTB<1:16> and may generate the second data blocking signal BKQ from the synthesized result of the second group SFTB<10, 12, 14, and 16> of the second shifted signal SFTB<1:16> when the second command blocking signal BLK_IB is enabled to have a logic "high" level. The second synthesis circuit 332 may generate the second data blocking signal BKQ having a logic "high" level when the second command blocking signal BLK_IB is enabled to have a logic "high" level while all of the second group SFTB<10, 12, 14, and 16> of the second shifted signal SFTB<1:16> have a logic "low" level.

Figure 16:
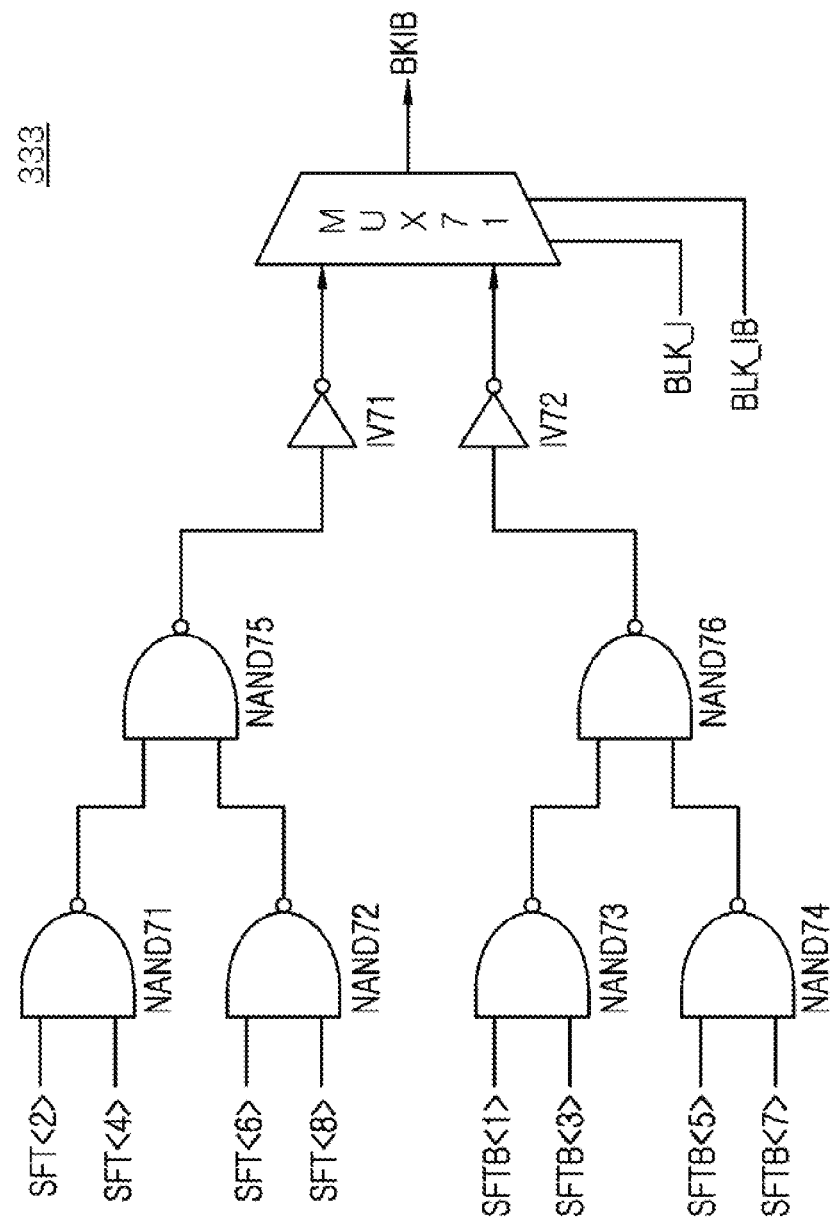
FIG. 16 illustrates a configuration of a third synthesis circuit included in the signal synthesis circuit of FIG. 13.

FIG. 16 illustrates a configuration of the third synthesis circuit 333. As illustrated in FIG. 16, the third synthesis circuit 333 may be realized using NAND gates NAND71, NAND72, NAND73, NAND74, NAND75, and NAND76; inverters IV71 and IV72; and a multiplexer MUX71.

The third synthesis circuit 333 may synthesize the third group SFT<2, 4, 6, and 8> of the first shifted signal SFT<1:16> and may generate the third data blocking signal BKIB from the synthesized result of the third group SFT<2, 4, 6, and 8> of the first shifted signal SFT<1:16> when the first command blocking signal BLK_I is enabled to have a logic "high" level. The third synthesis circuit 333 may generate the third data blocking signal BKIB having a logic "high" level when the first command blocking signal BLK_I is enabled to have a logic "high" level while all of the third group SFT<2, 4, 6, and 8> of the first shifted signal SFT<1:16> have a logic "low" level.

The third synthesis circuit 333 may synthesize the third group SFTB<1, 3, 5, and 7> of the second shifted signal SFTB<1:16> and may generate the third data blocking signal BKIB from the synthesized result of the third group SFTB<1, 3, 5, and 7> of the second shifted signal SFTB<1:16> when the second command blocking signal BLK_IB is enabled to have a logic "high" level. The third synthesis circuit 333 may generate the third data blocking signal BKIB having a logic "high" level when the second command blocking signal BLK_IB is enabled to have a logic "high" level while all of the third group SFTB<1, 3, 5, and 7> of the second shifted signal SFTB<1:16> have a logic "low" level.

Figure 17:
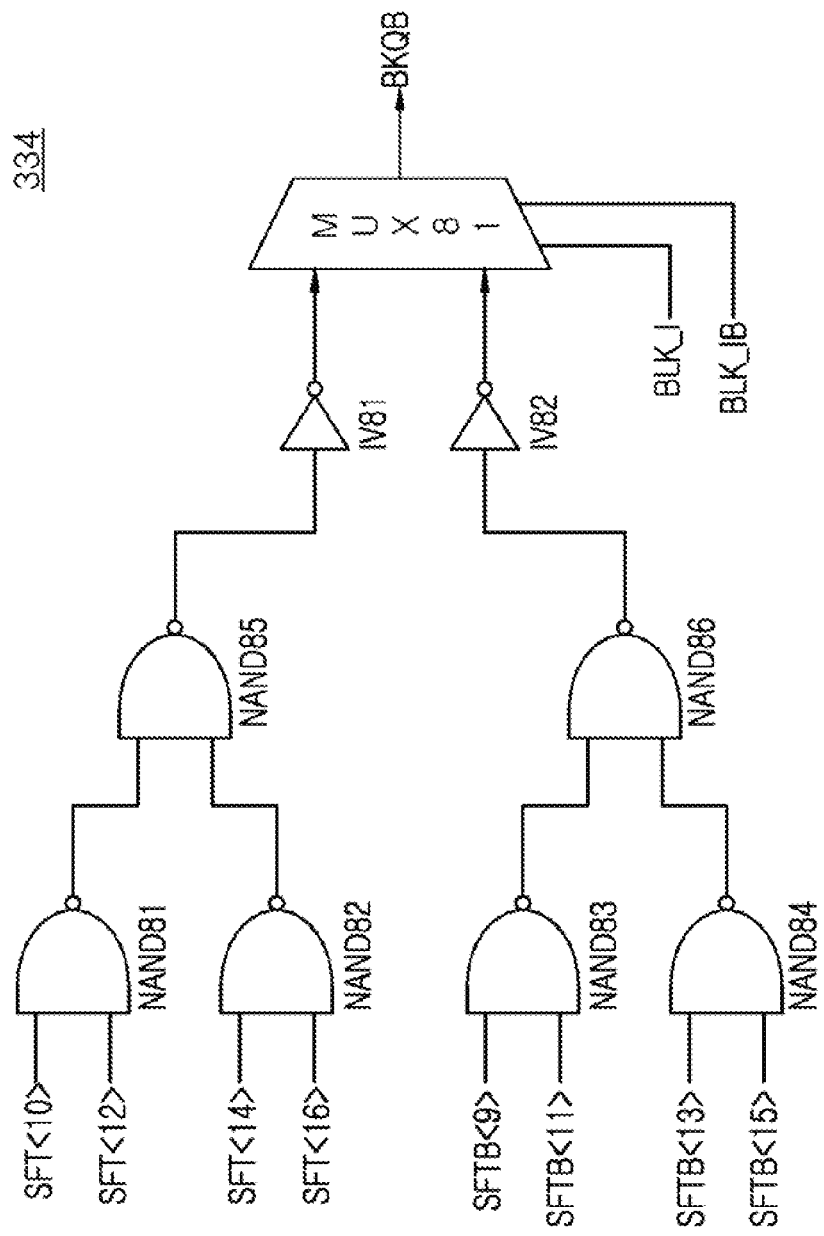
FIG. 17 illustrates a configuration of a fourth synthesis circuit included in the signal synthesis circuit of FIG. 13.

FIG. 17 illustrates a configuration of the fourth synthesis circuit 334. As illustrated in FIG. 17, the fourth synthesis circuit 334 may be realized using NAND gates NAND81, NAND82, NAND83, NAND84, NAND85, and NAND86; inverters IV81 and IV82; and a multiplexer MUX81.

The fourth synthesis circuit 334 may synthesize the fourth group SFT<10, 12, 14, and 16> of the first shifted signal SFT<1:16> and may generate the fourth data blocking signal BKQB from the synthesized result of the fourth group SFT<10, 12, 14, and 16> of the first shifted signal SFT<1:16> when the first command blocking signal BLK_I is enabled to have a logic "high" level. The fourth synthesis circuit 334 may generate the fourth data blocking signal BKQB having a logic "high" level when the first command blocking signal BLK_I is enabled to have a logic "high" level while all of the fourth group SFT<10, 12, 14, and 16> of the first shifted signal SFT<1:16> have a logic "low" level.

The fourth synthesis circuit 334 may synthesize the fourth group SFTB<9, 11, 13, and 15> of the second shifted signal SFTB<1:16> and may generate the fourth data blocking signal BKQB from the synthesized result of the fourth group SFTB<9, 11, 13, and 15> of the second shifted signal SFTB<1:16> when the second command blocking signal BLK_IB is enabled to have a logic "high" level. The fourth synthesis circuit 334 may generate the fourth data blocking signal BKQB having a logic "high" level when the second command blocking signal BLK_IB is enabled to have a logic "high" level while all of the fourth group SFTB<9, 11, 13, and 15> of the second shifted signal SFTB<1:16> have a logic "low" level.

The duty ratio adjustment operation of the semiconductor system 1 will be described hereinafter with reference to FIGS. 18 and 19.

First, the duty ratio adjustment operation performed by detecting valid periods of first to fourth bit data DO<1:4> of the output data DO<1:16> will be described hereinafter with reference to FIG. 18 in conjunction with a case for which the second internal clock signal DCLK<2> among the first to fourth internal clock signals DCLK<1:4> is generated to have a phase preceding a normal phase.

The data processing circuit 300 may receive the read command RD during the duty ratio adjustment operation and may align the first to fourth internal data ID<1:4> in synchronization with the first to fourth internal clock signals DCLK<1:4> to generate the first to fourth bit data DO<1:4> of the output data DO<1:16>. For the purpose of ease and convenience in explanation, the duty ratio adjustment operation will be described in conjunction with a case for which the data processing circuit 300 generates only the first to fourth bit data DO<1:4> as the output data.

The first bit datum DO<1> of the output data may be generated during a period from a point in time "T11" when the first internal clock signal DCLK<1> is generated to have a logic "high" level until a point in time "T12" when the second internal clock signal DCLK<2> is generated to have a logic "high" level. Thus, a valid period of the first bit datum DO<1> may correspond to a period between the point in time "T11" and the point in time "T12."

The second bit datum DO<2> of the output data may be generated during a period from the point in time "T12" when the second internal clock signal DCLK<2> is generated to have a logic "high" level until a point in time "T13" when the third internal clock signal DCLK<3> is generated to have a logic "high" level. Thus, a valid period of the second bit datum DO<2> may correspond to a period between the point in time "T12" and the point in time "T13."

The third bit datum DO<3> of the output data may be generated during a period from the point in time "T13" when the third internal clock signal DCLK<3> is generated to have a logic "high" level until a point in time "T14" when the fourth internal clock signal DCLK<4> is generated to have a logic "high" level. Thus, a valid period of the third bit datum DO<3> may correspond to a period between the point in time "T13" and the point in time "T14."

The fourth bit datum DO<4> of the output data may be generated during a period from the point in time "T14" when the fourth internal clock signal DCLK<4> is generated to have a logic "high" level until a point in time "T15" when the first internal clock signal DCLK<1> is generated to have a logic "high" level a second time. Thus, a valid period of the fourth bit datum DO<4> may correspond to a period between the point in time "T14" and the point in time "T15."

Figure 18:
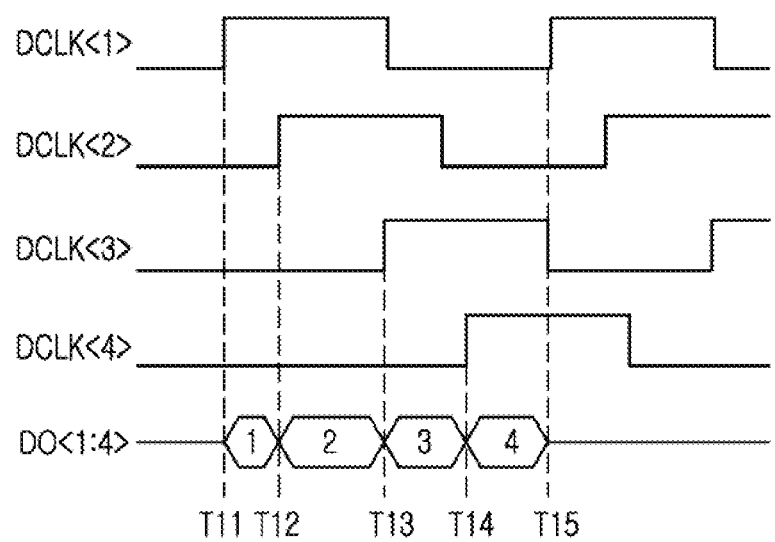
FIGS. 18 and 19 are timing diagrams illustrating a duty ratio adjustment operation of a semiconductor system according to an embodiment of the present disclosure.

For the case illustrated by FIG. 18, a valid period of the first bit datum DO<1> of the output data is shorter than a predetermined valid period and a valid period of the second bit datum DO<2> of the output data is longer than the predetermined valid period. Thus, the first semiconductor device 10 may change a logic level combination of the first code signal GCD and the second code signal PCD to delay the second bit datum DO<2> of the output data.

Next, the duty ratio adjustment operation performed by detecting valid periods of first to fourth bit data DO<1:4> of the output data DO<1:16> will be described hereinafter with reference to FIG. 19 in conjunction with a case for which phase differences between the first to fourth internal clock signals DCLK<1:4> are equal to each other.

The data processing circuit 300 may receive the read command RD during the duty ratio adjustment operation and may align the first to fourth internal data ID<1:4> in synchronization with the first to fourth internal clock signals DCLK<1:4> to generate the first to fourth bit data DO<1:4> of the output data. For the purpose of ease and convenience in explanation, the duty ratio adjustment operation will be described in conjunction with a case for which the data processing circuit 300 generates only the first to fourth bit data DO<1:4> as the output data.

The first bit datum DO<1> of the output data may be generated during a period from a point in time "T21" when the first internal clock signal DCLK<1> is generated to have a logic "high" level until a point in time "T22" when the second internal clock signal DCLK<2> is generated to have a logic "high" level. Thus, a valid period of the first bit datum DO<1> may correspond to a period between the point in time "T21" and the point in time "T22."

The second bit datum DO<2> of the output data may be generated during a period from the point in time "T22" when the second internal clock signal DCLK<2> is generated to have a logic "high" level until a point in time "T23" when the third internal clock signal DCLK<3> is generated to have a logic "high" level. Thus, a valid period of the second bit datum DO<2> may correspond to a period between the point in time "T22" and the point in time "T23."

The third bit datum DO<3> of the output data may be generated during a period from the point in time "T23" when the third internal clock signal DCLK<3> is generated to have a logic "high" level until a point in time "T24" when the fourth internal clock signal DCLK<4> is generated to have a logic "high" level. Thus, a valid period of the third bit datum DO<3> may correspond to a period between the point in time "T23" and the point in time "T24."

The fourth bit datum DO<4> of the output data may be generated during a period from the point in time "T24" when the fourth internal clock signal DCLK<4> is generated to have a logic "high" level until a point in time "T25" when the first internal clock signal DCLK<1> is generated to have a logic "high" level a second time. Thus, a valid period of the fourth bit datum DO<4> may correspond to a period between the point in time "T24" and the point in time "T25."

Figure 19:
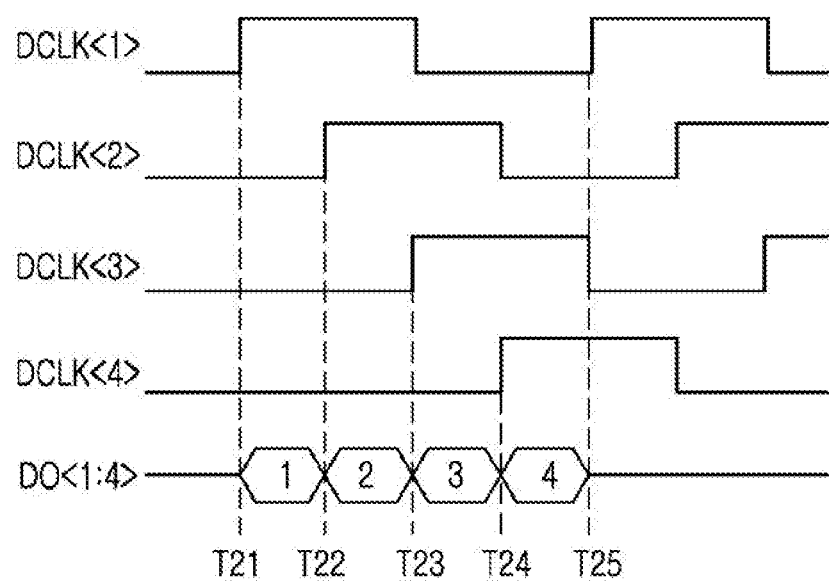

For the case illustrated by FIG. 19, all of the first to fourth bit data DO<1:4> of the output data are generated to have the same valid period. Thus, the first semiconductor device 10 may fix logic levels of the first code signal GCD and the second code signal PCD without any change.

As described above, a semiconductor system according to an embodiment may detect valid periods of output data during a duty ratio adjustment operation and may improve the reliability of the output data by controlling a code signal for adjusting a phase of an internal clock signal according to the detection result of the valid periods of the output data. In addition, the semiconductor system may detect the valid periods of the output data during the duty ratio adjustment operation and may efficiently perform the duty ratio adjustment operation by diversely controlling the code signal for adjusting a phase of the internal clock signal according to the detection result of the valid periods of the output data.

Figure 20:
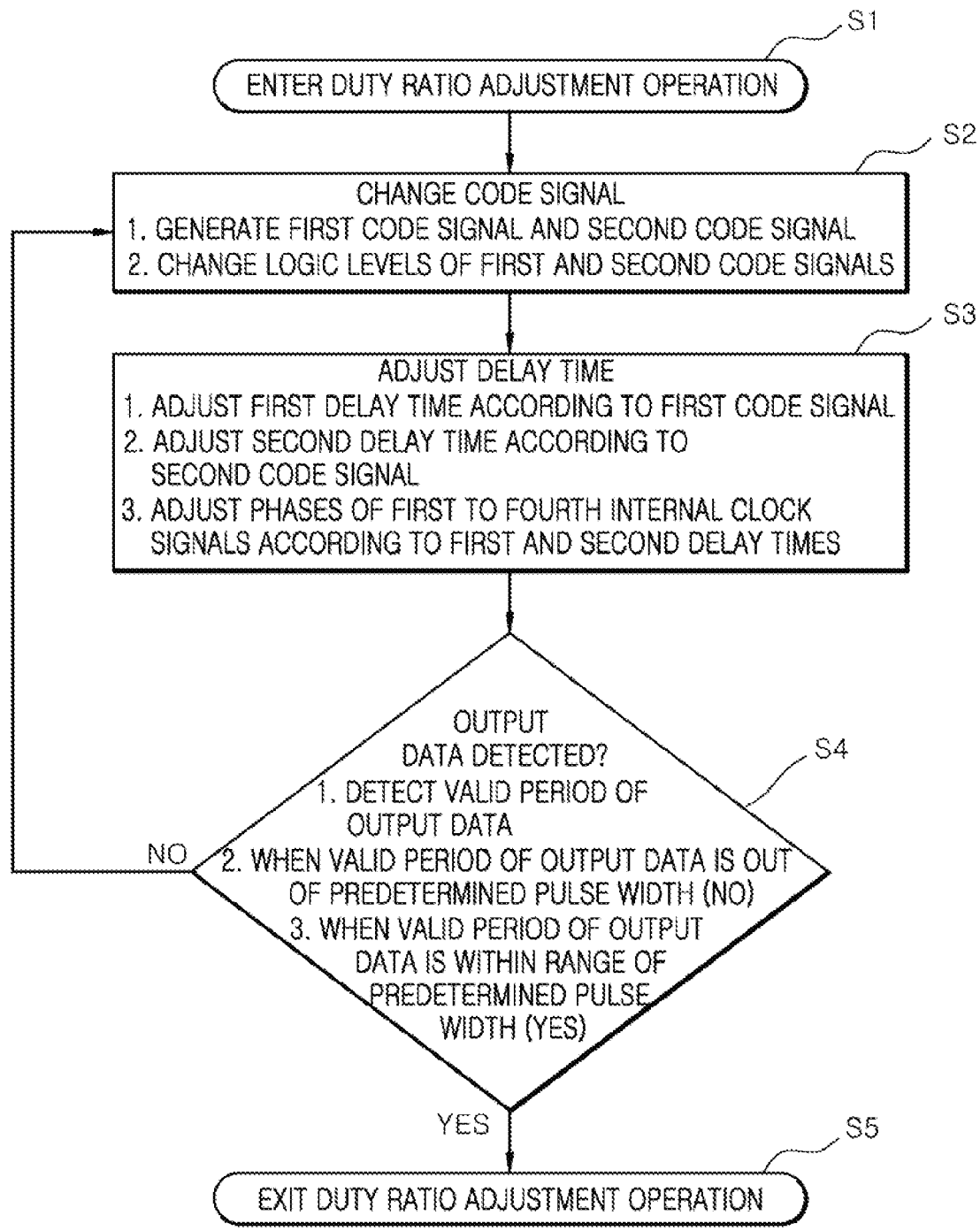
FIG. 20 is a flowchart illustrating a duty ratio adjustment operation of a semiconductor system according to an embodiment of the present disclosure.

A method of performing the duty ratio adjustment operation according to an embodiment will be described hereinafter with reference to FIG. 20.

The method of performing the duty ratio adjustment operation may include a step S1 of entering the duty ratio adjustment operation, a step S2 of changing a code signal, a step S3 of adjusting a delay time, a step S4 of detecting output data, and a step S5 of exiting the duty ratio adjustment operation.

The step S1 of entering the duty ratio adjustment operation may be achieved when the operation code signal OP<1:2> has a predetermined logic level combination.

The step S2 of changing the code signal may be performed to generate the first code signal GCD<1:16> and the second code signal PCD<1:12>. The step S2 of changing the code signal may be performed to change logic levels of the first code signal GCD<1:16> and the second code signal PCD<1:12>.

The step S3 of adjusting the delay time may be performed to adjust a first delay time based on the first code signal GCD<1:16> and to adjust a second delay time based on the second code signal PCD<1:12>. The step S3 of adjusting the delay time may be performed to adjust phases of the first to fourth internal clock signals DCLK<1:4> generated from the clock signal CLK based on the first and second delay times.

The step S4 of detecting the output data may be performed to detect valid periods of the output data DO<1:16> generated by aligning the internal data ID<1:16> in synchronization with the first to fourth internal clock signals DCLK<1:4>. When the valid periods of the output data DO<1:16> are outside of a period corresponding to a predetermined pulse width at the step S4 ("NO"), the step S2 of changing the code signal may be performed again. When the valid periods of the output data DO<1:16> are within the range of the predetermined pulse width at the step S4 ("YES"), the step S5 of exiting the duty ratio adjustment operation may be performed.

Figure 21:
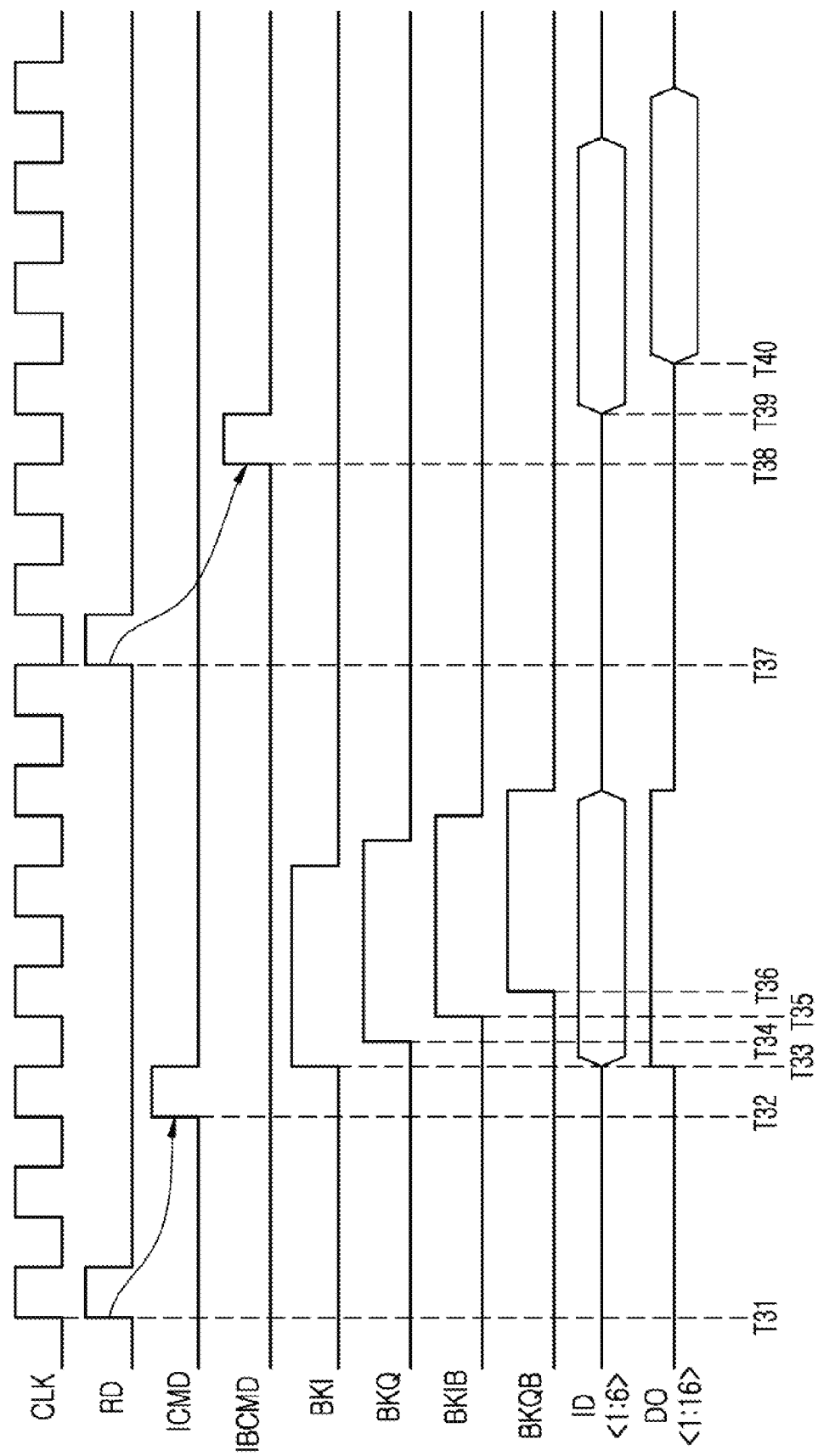
FIGS. 21 and 22 are timing diagrams illustrating an operation for interrupting generation of output data according to a point in time when a read command is inputted during a duty ratio adjustment operation of a semiconductor system according to an embodiment of the present disclosure.

The duty ratio adjustment operation of a semiconductor system according to an embodiment will be described hereinafter with reference to FIG. 21 in conjunction with a case for which generation of the output data is interrupted when a read command is inputted in synchronization with a rising edge of a clock signal.

At a point in time "T31," the first semiconductor device 10 may output the clock signal CLK, the read command RD, the first code signal GCD<1:16>, the second code signal PCD<1:12>, and the first command blocking signal BLK_I to the second semiconductor device 20. In such a case, the read command RD may be outputted from the first semiconductor device 10 in synchronization with a rising edge of the clock signal CLK.

The frequency division circuit 110 may divide a frequency of the clock signal CLK to generate the first division clock signal ICLK, the second division clock signal QCLK, the third division clock signal IBCLK, and the fourth division clock signal QBCLK.

The phase adjustment circuit 120 may delay the first to fourth division clock signals ICLK, QCLK, IBCLK, and QBCLK by a delay time adjusted according to the first and second code signals GCD<1:16> and PCD<1:12> to generate the first internal clock signal DCLK<1>, the second internal clock signal DCLK<2>, the third internal clock signal DCLK<3>, and the fourth internal clock signal DCLK<4>.

At a point in time "T32," the internal command generation circuit 310 may be synchronized with the clock signal CLK to generate the first internal command ICMD which is enabled to have a logic "high" level by the read command RD inputted at the point in time "T31."

The shift circuit 320 may shift the first internal command ICMD in synchronization with the first division clock signal ICLK, the second division clock signal QCLK, the third division clock signal IBCLK, and the fourth division clock signal QBCLK to generate the first shifted signal SFT<1:16>.

At a point in time "T33," the first synthesis circuit 331 may synthesize the first group SFT<1, 3, 5, and 7> of the first shifted signal SFT<1:16> to generate the first data blocking signal BKI having a logic "high" level from the synthesized result based on the first command blocking signal BLK_I having a logic "high" level.

The core circuit 200 may output the internal data ID<1:16> stored therein based on the read command RD which is inputted at the point in time "T31".

The data output circuit 340 may generate the first to fourth bit data DO<1:4> of the output data DO<1:16> from the power supply voltage VDD based on the first data blocking signal BKI.

At a point in time "T34," the second synthesis circuit 332 may synthesize the second group SFT<9, 11, 13, and 15> of the first shifted signal SFT<1:16> to generate the second data blocking signal BKQ having a logic "high" level from the synthesized result based on the first command blocking signal BLK_I having a logic "high" level.

The data output circuit 340 may generate the fifth to eighth bit data DO<5:8> of the output data DO<1:16> from the power supply voltage VDD based on the second data blocking signal BKQ.

At a point in time "T35," the third synthesis circuit 333 may synthesize the third group SFT<2, 4, 6, and 8> of the first shifted signal SFT<1:16> to generate the third data blocking signal BKIB having a logic "high" level from the synthesized result based on the first command blocking signal BLK_I having a logic "high" level.

The data output circuit 340 may generate the ninth to twelfth bit data DO<9:12> of the output data DO<1:16> from the power supply voltage VDD based on the third data blocking signal BKIB.

At a point in time "T36," the fourth synthesis circuit 334 may synthesize the fourth group SFT<10, 12, 14, and 16> of the first shifted signal SFT<1:16> to generate the fourth data blocking signal BKQB having a logic "high" level from the synthesized result based on the first command blocking signal BLK_I having a logic "high" level.

The data output circuit 340 may generate the thirteenth to sixteenth bit data DO<13:16> of the output data DO<1:16> from the power supply voltage VDD based on the fourth data blocking signal BKQB.

At a point in time "T37," the first semiconductor device 10 may output the clock signal CLK, the read command RD, the first code signal GCD<1:16>, the second code signal PCD<1:12>, and the first command blocking signal BLK_I to the second semiconductor device 20. In such a case, the read command RD may be outputted from the first semiconductor device 10 in synchronization with a falling edge of the clock signal CLK.

The frequency division circuit 110 may divide a frequency of the clock signal CLK to generate the first division clock signal ICLK, the second division clock signal QCLK, the third division clock signal IBCLK, and the fourth division clock signal QBCLK.

The phase adjustment circuit 120 may delay the first to fourth division clock signals ICLK, QCLK, IBCLK, and QBCLK by a delay time adjusted according to the first and second code signals GCD<1:16> and PCD<1:12> to generate the first internal clock signal DCLK<1>, the second internal clock signal DCLK<2>, the third internal clock signal DCLK<3>, and the fourth internal clock signal DCLK<4>.

At a point in time "T38," the internal command generation circuit 310 may be synchronized with the clock signal CLK to generate the second internal command IBCMD which is enabled to have a logic "high" level by the read command RD inputted at the point in time "T37."

The shift circuit 320 may shift the second internal command IBCMD in synchronization with the first division clock signal ICLK, the second division clock signal QCLK, the third division clock signal IBCLK, and the fourth division clock signal QBCLK to generate the second shifted signal SFTB<1:16>. In such a case, the shift circuit 320 does not generate the first shifted signal SFT<1:16>.

The signal synthesis circuit 330 may generate the first data blocking signal BKI having a logic "low" level, the second data blocking signal BKQ having a logic "low" level, the third data blocking signal BKIB having a logic "low" level, and the fourth data blocking signal BKQB having a logic "low" level based on the first shifted signal SFT<1:16> and the first command blocking signals BLK_I.

At a point in time "T39," the core circuit 200 may output the internal data ID<1:16> stored therein based on the read command RD which is inputted at the point in time "T37."

At a point in time "T40," the data output circuit 340 may be synchronized with the first to fourth internal clock signals DCLK<1:4> to generate the output data DO<1:16> from the internal data ID<1:16>.

Figure 22:
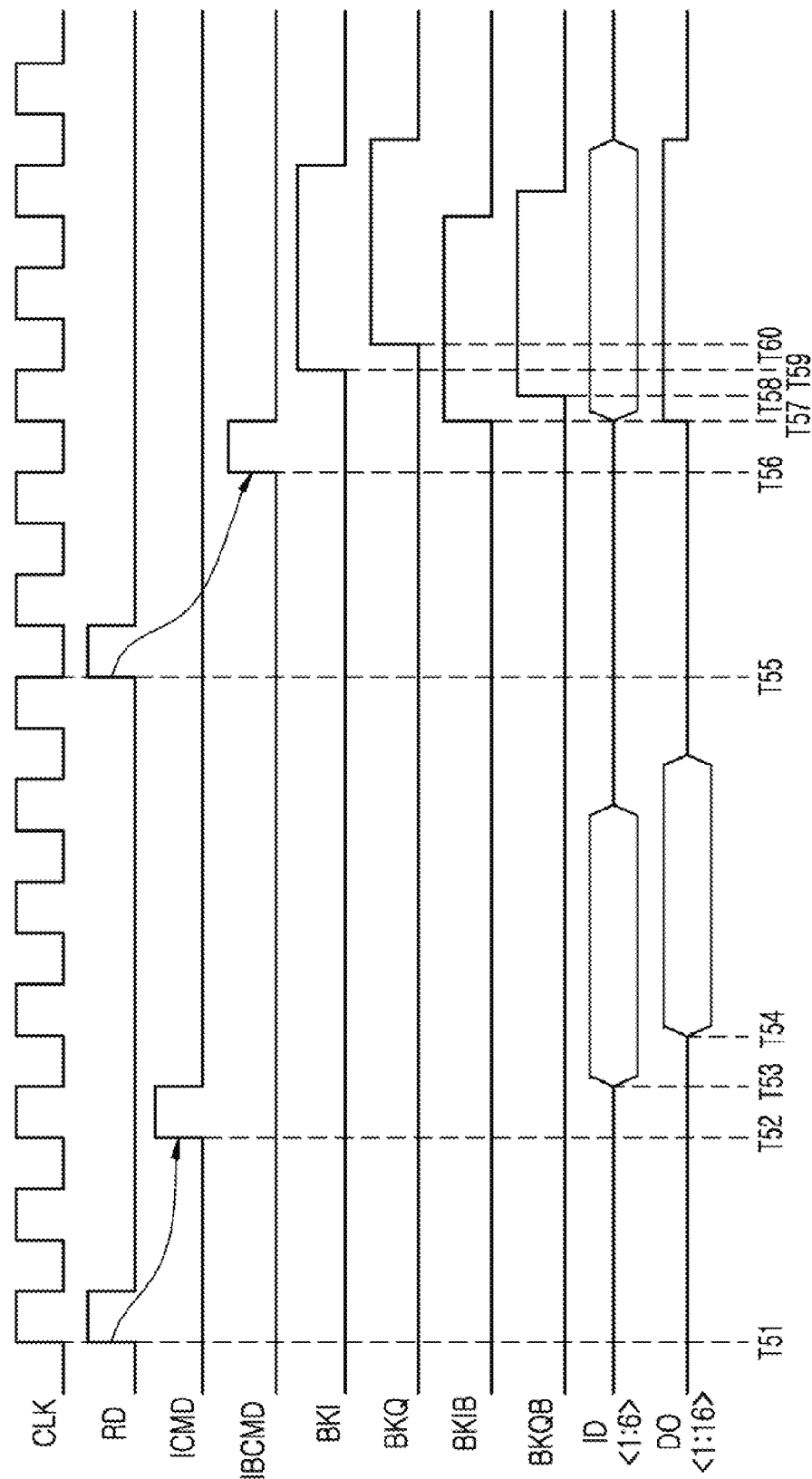

The duty ratio adjustment operation of a semiconductor system according to an embodiment will be described hereinafter with reference to FIG. 22 in conjunction with a case for which generation of the output data is interrupted when a read command is inputted in synchronization with a falling edge of a clock signal.

At a point in time "T51," the first semiconductor device 10 may output the clock signal CLK, the read command RD, the first code signal GCD<1:16>, the second code signal PCD<1:12>, and the second command blocking signal BLK_IB to the second semiconductor device 20. In such a case, the read command RD may be outputted from the first semiconductor device 10 in synchronization with a rising edge of the clock signal CLK.

The frequency division circuit 110 may divide a frequency of the clock signal CLK to generate the first division clock signal ICLK, the second division clock signal QCLK, the third division clock signal IBCLK, and the fourth division clock signal QBCLK.

The phase adjustment circuit 120 may delay the first to fourth division clock signals ICLK, QCLK, IBCLK, and QBCLK by a delay time adjusted according to the first and second code signals GCD<1:16> and PCD<1:12> to generate the first internal clock signal DCLK<1>, the second internal clock signal DCLK<2>, the third internal clock signal DCLK<3>, and the fourth internal clock signal DCLK<4>.

At a point in time "T52," the internal command generation circuit 310 may be synchronized with the clock signal CLK to generate the first internal command ICMD which is enabled to have a logic "high" level by the read command RD inputted at the point in time "T51".

The shift circuit 320 may shift the first internal command ICMD in synchronization with the first division clock signal ICLK, the second division clock signal QCLK, the third division clock signal IBCLK, and the fourth division clock signal QBCLK to generate the first shifted signal SFT<1:16>. In such a case, the shift circuit 320 does not generate the second shifted signal SFTB<1:16>.

The signal synthesis circuit 330 may generate the first data blocking signal BKI having a logic "low" level, the second data blocking signal BKQ having a logic "low" level, the third data blocking signal BKIB having a logic "low" level, and the fourth data blocking signal BKQB having a logic "low" level based on the second shifted signal SFTB<1:16> and the second command blocking signal BLK_IB.

At a point in time "T53," The core circuit 200 may output the internal data ID<1:16> stored therein based on the read command RD which is inputted at the point in time "T51."

At a point in time "T54," the data output circuit 340 may be synchronized with the first to fourth internal clock signals DCLK<1:4> to generate the output data DO<1:16> from the internal data ID<1:16>.

At a point in time "T55," the first semiconductor device 10 may output the clock signal CLK, the read command RD, the first code signal GCD<1:16>, the second code signal PCD<1:12>, and the second command blocking signal BLK_IB to the second semiconductor device 20. In such a case, the read command RD may be outputted from the first semiconductor device 10 in synchronization with a falling edge of the clock signal CLK.

The frequency division circuit 110 may divide a frequency of the clock signal CLK to generate the first division clock signal ICLK, the second division clock signal QCLK, the third division clock signal IBCLK, and the fourth division clock signal QBCLK.

The phase adjustment circuit 120 may delay the first to fourth division clock signals ICLK, QCLK, IBCLK, and QBCLK by a delay time adjusted according to the first and second code signals GCD<1:16> and PCD<1:12> to generate the first internal clock signal DCLK<1>, the second internal clock signal DCLK<2>, the third internal clock signal DCLK<3>, and the fourth internal clock signal DCLK<4>.

At a point in time "T56," the internal command generation circuit 310 may be synchronized with the clock signal CLK to generate the second internal command IBCMD which is enabled to have a logic "high" level by the read command RD inputted at the point in time "T55."

The shift circuit 320 may shift the second internal command IBCMD in synchronization with the first division clock signal ICLK, the second division clock signal QCLK, the third division clock signal IBCLK, and the fourth division clock signal QBCLK to generate the second shifted signal SFTB<1:16>.

At a point in time "T57," the third synthesis circuit 333 may synthesize the third group SFTB<1, 3, 5, and 7> of the second shifted signal SFTB<1:16> to generate the third data blocking signal BKIB having a logic "high" level from the synthesized result based on the second command blocking signal BLK_IB having a logic "high" level.

The core circuit 200 may output the internal data ID<1: 16> stored therein based on the read command RD which is inputted at the point in time "T55."

The data output circuit 340 may generate the ninth to twelfth bit data DO<9:12> of the output data DO<1:16> from the power supply voltage VDD based on the third data blocking signal BKIB.

At a point in time "T58," the fourth synthesis circuit 334 may synthesize the fourth group SFTB<9, 11, 13, and 15> of the second shifted signal SFTB<1:16> to generate the fourth data blocking signal BKQB having a logic "high" level from the synthesized result based on the second command blocking signal BLK_IB having a logic "high" level.

The data output circuit 340 may generate the thirteenth to sixteenth bit data DO<13:16> of the output data DO<1:16> from the power supply voltage VDD based on the fourth data blocking signal BKQB.

At a point in time "T59," the first synthesis circuit 331 may synthesize the first group SFTB<2, 4, 6, and 8> of the second shifted signal SFTB<1:16> to generate the first data blocking signal BKI having a logic "high" level from the synthesized result based on the second command blocking signal BLK_IB having a logic "high" level.

The data output circuit 340 may generate the first to fourth bit data DO<1:4> of the output data DO<1:16> from the power supply voltage VDD based on the first data blocking signal BKI.

At a point in time "T60," the second synthesis circuit 332 may synthesize the second group SFTB<10, 12, 14, and 16> of the second shifted signal SFTB<1:16> to generate the second data blocking signal BKQ having a logic "high" level from the synthesized result based on the second command blocking signal BLK_IB having a logic "high" level.

The data output circuit 340 may generate the fifth to eighth bit data DO<5:8> of the output data DO<1:16> from the power supply voltage VDD based on the second data blocking signal BKQ.

As described above, a semiconductor system according to an embodiment may stably perform a duty ratio adjustment operation by selectively interrupting generation of output data when a read command is inputted in synchronization with a rising edge or a falling edge of a clock signal during the duty ratio adjustment operation.

Figure 23:
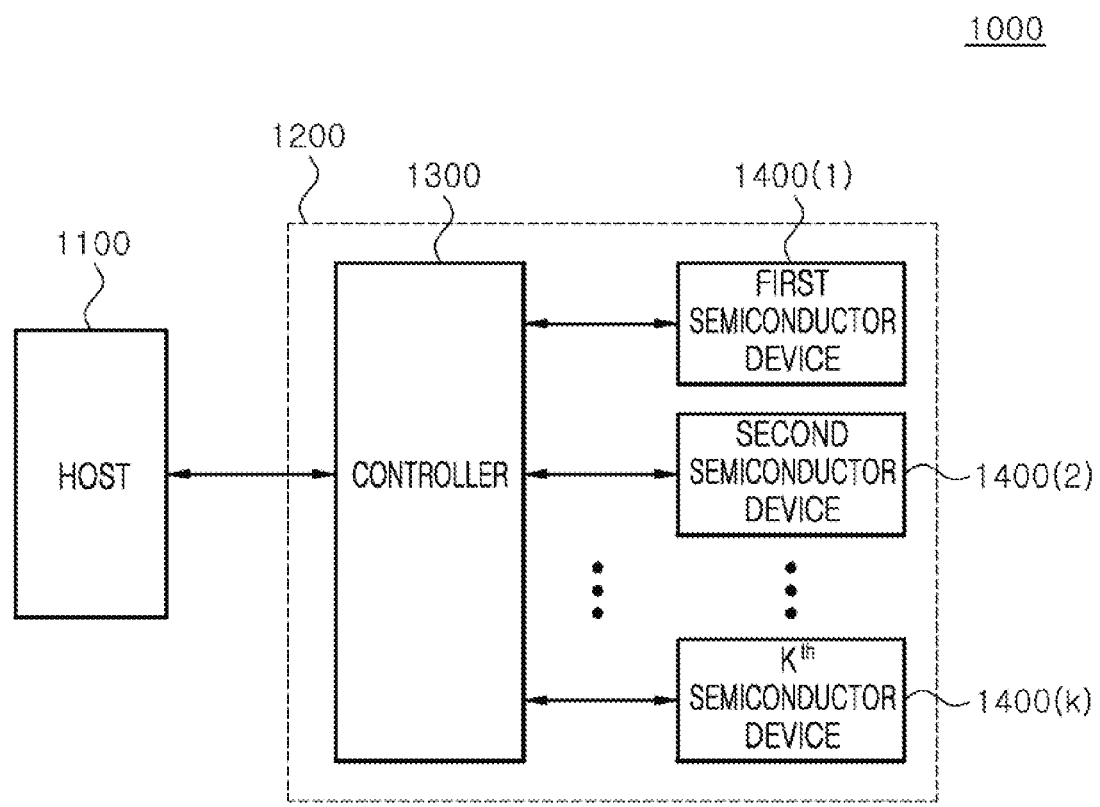
FIG. 23 is a block diagram illustrating a configuration of an electronic system according to an embodiment of the present disclosure.

FIG. 23 is a block diagram illustrating a configuration of an electronic system 1000 according to an embodiment of the present disclosure. As illustrated in FIG. 23, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the duty ratio adjustment operation and the read operation. Each of the semiconductor devices 1400(K:1) may adjust phase differences between the internal clock signals to obtain valid periods of the output data. Each of the semiconductor devices 1400(K:1) may stably perform the read operation by interrupting generation of the output data according to a point in time when the read command in inputted.

The controller 1300 may be realized using the first semiconductor device 10 illustrated in FIG. 1. Each of the semiconductor devices 1400(K:1) may be realized using the second semiconductor device 20 illustrated in FIG. 1. In some embodiments, each of the semiconductor devices 1400(K:1) may be realized using any of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
    an internal clock generation circuit configured to delay first to fourth division clock signals, which are generated by dividing a frequency of a clock signal, by a delay time adjusted based on a first code signal and a second code signal to generate first to fourth internal clock signals; and
    a data processing circuit configured to align internal data in synchronization with the first to fourth internal clock signals to generate output data and configured to interrupt generation of the output data based on first and second command blocking signals according to a point in time when a read command is inputted, and
    wherein the data processing circuit is configured to output a voltage having a constant level while the data processing circuit interrupts generation of the output data.

2. The semiconductor device of claim 1, wherein the internal clock generation circuit is configured to adjust a first delay time based on the first code signal and adjust a second delay time based on the second code signal.

3. The semiconductor device of claim 1, wherein the semiconductor device is configured to generate the first and second code signals by detecting valid periods of the output data during the duty ratio adjustment operation.

4. The semiconductor device of claim 1, wherein the internal clock generation circuit comprises:
    a frequency division circuit configured to divide a frequency of the clock signal to generate the first to fourth division clock signals; and
    a phase adjustment circuit configured to delay the first to fourth division clock signals by the delay time adjusted by the first and second code signals to generate the first to fourth internal clock signals.

5. The semiconductor device of claim 4, wherein the phase adjustment circuit comprises:
a first phase adjustment circuit configured to delay the first to fourth division clock signals by a first delay time adjusted according to the first code signal to generate first to fourth delay clock signals; and
a second phase adjustment circuit configured to delay the first to fourth delay clock signals by a second delay time adjusted according to the second code signal to generate the first to fourth internal clock signals.

6. The semiconductor device of claim 5, further comprising:
a first plurality of capacitors configured to be selectively activated by the first code signal and to set the first delay time of the first phase adjustment circuit; and
a second plurality of capacitors configured to be selectively activated by the second code signal and to set the second delay time of the second phase adjustment circuit.

7. The semiconductor device of claim 1, wherein the data processing circuit comprises:
an internal command generation circuit configured to be synchronized with the clock signal to generate a first internal command and a second internal command, one of which is selectively enabled according to a point in time when the read command is inputted to the internal command generation circuit;
a shift circuit configured to shift the first and second internal commands in synchronization with the first to fourth division clock signals to generate first and second shifted signals;
a signal synthesis circuit configured to synthesize the first and second shifted signals based on the first and second command blocking signals to generate first to fourth data blocking signals; and
a data output circuit configured to be synchronized with the first to fourth internal clock signals to generate the output data from the internal data and configured to generate the output data from a power supply voltage based on the first to fourth data blocking signals.

8. A semiconductor system comprising:
a first semiconductor device configured to detect valid periods of output data during a duty ratio adjustment operation and configured to generate first and second code signals and first and second command blocking signals; and
a second semiconductor device configured to generate the output data from internal data in synchronization with first to fourth internal clock signals generated by delaying first to fourth division clock signals by a delay time adjusted based on the first and second code signals and configured to interrupt generation of the output data based on the first and second command blocking signals, and
wherein the second semiconductor device is configured to output a voltage having a constant level while the second semiconductor device interrupts generation of the output data.

9. The semiconductor system of claim 8, wherein the first semiconductor device is configured to perform the duty ratio adjustment operation when an operation code signal inputted to the first semiconductor device has a predetermined logic level combination.

10. The semiconductor system of claim 8, wherein the first semiconductor device is configured to change a logic level combination of the first and second command blocking signals until the output data are generated to have a valid period corresponding to a predetermined pulse width during the duty ratio adjustment operation.

11. The semiconductor system of claim 8, wherein the second semiconductor device is configured to drive the output data to an external voltage level based on the first and second command blocking signals.

12. The semiconductor system of claim 8,
wherein the first semiconductor device configured to generate the first command blocking signal enabled to interrupt generation of the output data when a read command is inputted in synchronization with a rising edge of the clock signal; and
wherein the first semiconductor device configured to generate the second command blocking signal enabled to interrupt generation of the output data when the read command is inputted in synchronization with a falling edge of the clock signal.

13. The semiconductor system of claim 8, wherein the second semiconductor device comprises:
an internal clock generation circuit configured to delay the first to fourth division clock signals by a delay time adjusted by the first and second code signals to generate the first to fourth internal clock signals;
a core circuit configured to output the internal data stored therein based on a read command; and
a data processing circuit configured to align the internal data in synchronization with the first to fourth internal clock signals to generate the output data and configured to interrupt generation of the output data based on first and second command blocking signals.

14. The semiconductor system of claim 13, wherein the internal clock generation circuit comprises:
a frequency division circuit configured to divide a frequency of the clock signal to generate the first to fourth division clock signals; and
a phase adjustment circuit configured to delay the first to fourth division clock signals by the delay time adjusted based on the first and second code signals to generate the first to fourth internal clock signals.

15. The semiconductor system of claim 14, wherein the phase adjustment circuit comprises:
a first phase adjustment circuit configured to delay the first to fourth division clock signals by a first delay time adjusted according to the first code signal to generate first to fourth delay clock signals; and
a second phase adjustment circuit configured to delay the first to fourth delay clock signals by a second delay time adjusted according to the second code signal to generate the first to fourth internal clock signals.

16. The semiconductor system of claim 15, further comprising:
a first plurality of capacitors configured to be selectively activated by the first code signal and to set the first delay time of the first phase adjustment circuit; and
a second plurality of capacitors configured to be selectively activated by the second code signal and to set the second delay time of the second phase adjustment circuit.

17. The semiconductor system of claim 13, wherein the data processing circuit comprises:
an internal command generation circuit configured to be synchronized with the clock signal to generate a first internal command and a second internal command, one of which is selectively enabled according to a point in time when the read command is inputted to the internal command generation circuit;

a shift circuit configured to shift the first and second internal commands in synchronization with the first to fourth division clock signals to generate first and second shifted signals;

a signal synthesis circuit configured to synthesize the first and second shifted signals based on the first and second command blocking signals to generate first to fourth data blocking signals; and a data output circuit configured to be synchronized with the first to fourth internal clock signals to generate the output data from the internal data and configured to generate the output data from a power supply voltage based on the first to fourth data blocking signals.

18. The semiconductor system of claim 17, wherein the shift circuit comprises:

a first shift circuit configured to shift the first internal command in synchronization with the first and fourth division clock signals to generate the first shifted signal; and a second shift circuit configured to shift the second internal command in synchronization with the second and third division clock signals to generate the second shifted signal.

19. The semiconductor system of claim 17, wherein the signal synthesis circuit comprises:

a first synthesis circuit configured to synthesize a first group of the first shifted signal and a first group of the second shifted signal and configured to generate the first data blocking signal from the synthesized result based on the first and second command blocking signals;

a second synthesis circuit configured to synthesize a second group of the first shifted signal and a second group of the second shifted signal and configured to generate the second data blocking signal from the synthesized result based on the first and second command blocking signals;

a third synthesis circuit configured to synthesize a third group of the first shifted signal and a third group of the second shifted signal and configured to generate the third data blocking signal from the synthesized result based on the first and second command blocking signals; and a fourth synthesis circuit configured to synthesize a fourth group of the first shifted signal and a fourth group of the second shifted signal and configured to generate the fourth data blocking signal from the synthesized result based on the first and second command blocking signals.

20. A method of performing a duty ratio adjustment operation, the method comprising:

entering the duty ratio adjustment operation according to an operation code signal;

changing logic levels of a first code signal and a second code signal during the duty ratio adjustment operation;

adjusting phases of internal clock signals generated from a clock signal using delay times which are set by the first code signal and the second code signal;

aligning internal data in synchronization with the internal clock signals to generate output data and detecting valid periods of the output data, and wherein the output data remains a constant level during invalid periods.

21. The method of claim 20, wherein the duty ratio adjustment operation terminates when the valid periods of the output data correspond to a predetermined pulse width when aligning the internal data in synchronization with the internal clock signals to generate the output data and detecting the valid periods of the output data; and wherein changing the logic levels of the first code signal and the second code signal during the duty ratio adjustment operation is performed again when the valid periods of the output data are outside of the predetermined pulse width when aligning the internal data in synchronization with the internal clock signals to generate the output data and detecting the valid periods of the output data.

* * * * *